US 11,929,428 B2

(12) United States Patent
Smith, Jr. et al.

(10) Patent No.: US 11,929,428 B2
(45) Date of Patent: Mar. 12, 2024

(54) CIRCUITS AND GROUP III-NITRIDE HIGH-ELECTRON MOBILITY TRANSISTORS WITH BURIED P-TYPE LAYERS IMPROVING OVERLOAD RECOVERY AND PROCESS FOR IMPLEMENTING THE SAME

(71) Applicant: CREE, INC., Durham, NC (US)

(72) Inventors: Thomas J. Smith, Jr., Raleigh, NC (US); Saptharishi Sriram, Cary, NC (US); Charles W. Richards, IV, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 224 days.

(21) Appl. No.: 17/321,992

(22) Filed: May 17, 2021

(65) Prior Publication Data

US 2022/0367696 A1 Nov. 17, 2022

(51) Int. Cl.
*H02H 3/06* (2006.01)
*H01L 21/76* (2006.01)
(Continued)

(52) U.S. Cl.
CPC ...... *H01L 29/7786* (2013.01); *H01L 21/7605* (2013.01); *H01L 21/765* (2013.01);
(Continued)

(58) Field of Classification Search
CPC ............. H01L 29/7786; H01L 29/2003; H01L 29/205; H01L 29/402; H01L 29/66462;
(Continued)

(56) References Cited

U.S. PATENT DOCUMENTS

| 5,289,015 A | 2/1994 | Chirovsky et al. |
| 5,318,915 A | 6/1994 | Baliga et al. |

(Continued)

FOREIGN PATENT DOCUMENTS

| CN | 1717811 A | 1/2006 |
| CN | 102623493 A | 8/2012 |

(Continued)

OTHER PUBLICATIONS

R R. Pela, C. Caetano, M. Marques, L. G. Ferreira, J. Furthmuller, and L. K. Teles, "Accurate band gaps of AlGaN, InGaN, and AlInN alloys calculations based on LDA-1/2 approach", Appl. Phys. Lett. 98, 151907 (2011) Appl. Phys. Lett. 98, 151907; 3 pages. (Year: 2011).

(Continued)

*Primary Examiner* — Bryan R Perez
(74) *Attorney, Agent, or Firm* — BakerHostetler

(57) ABSTRACT

An apparatus includes a substrate; a group III-Nitride barrier layer; a source electrically coupled to the group III-Nitride barrier layer; a gate on the group III-Nitride barrier layer; a drain electrically coupled to the group III-Nitride barrier layer; a p-region being arranged at or below the group III-Nitride barrier layer; and a recovery enhancement circuit configured to reduce an impact of an overload received by the gate. Additionally, at least a portion of the p-region is arranged vertically below at least one of the following: the source, the gate, an area between the gate and the drain.

64 Claims, 16 Drawing Sheets

(51) Int. Cl.
| | |
|---|---|
| *H01L 21/765* | (2006.01) |
| *H01L 29/20* | (2006.01) |
| *H01L 29/205* | (2006.01) |
| *H01L 29/40* | (2006.01) |
| *H01L 29/66* | (2006.01) |
| *H01L 29/778* | (2006.01) |
| *H02H 3/12* | (2006.01) |

(52) U.S. Cl.
CPC ........ *H01L 29/2003* (2013.01); *H01L 29/205* (2013.01); *H01L 29/402* (2013.01); *H01L 29/66462* (2013.01); *H02H 3/06* (2013.01); *H02H 3/12* (2013.01)

(58) Field of Classification Search
CPC ........... H01L 29/7783; H01L 29/41758; H01L 29/0891; H01L 29/7787; H01L 29/0623; H01L 21/047; H01L 21/761; H01L 21/7605; H01L 21/765; H02H 3/06–12; H03K 2217/0018
See application file for complete search history.

(56) References Cited

U.S. PATENT DOCUMENTS

| | | |
|---|---|---|
| 6,639,277 B2 | 10/2003 | Rumennik et al. |
| 6,956,239 B2 | 10/2005 | Sriram |
| 7,646,043 B2 | 1/2010 | Sriram et al. |
| 7,696,566 B2 | 4/2010 | Disney |
| 7,812,369 B2 | 10/2010 | Chini et al. |
| 8,698,162 B2 | 4/2014 | Lee et al. |
| 8,759,879 B1 | 6/2014 | Tipirneni et al. |
| 8,890,211 B1 | 11/2014 | Mayo et al. |
| 8,901,609 B1 | 12/2014 | Chen et al. |
| 9,337,332 B2 | 5/2016 | Chu et al. |
| 9,484,862 B2 | 11/2016 | De Rooij et al. |
| 9,621,153 B2 | 4/2017 | Ikeda et al. |
| 10,290,730 B1 | 5/2019 | Yang et al. |
| 2002/0066960 A1 | 6/2002 | Ring |
| 2003/0141518 A1 | 7/2003 | Yokogawa et al. |
| 2004/0099888 A1 | 5/2004 | Sriram |
| 2004/0124435 A1 | 7/2004 | D'Evelyn et al. |
| 2004/0149993 A1 | 8/2004 | McClure et al. |
| 2004/0201037 A1 | 10/2004 | Fareed et al. |
| 2005/0121694 A1 | 6/2005 | Mun et al. |
| 2005/0224809 A1 | 10/2005 | Sriram |
| 2006/0125001 A1 | 6/2006 | Sriram |
| 2007/0051977 A1 | 3/2007 | Saito et al. |
| 2007/0059873 A1 | 3/2007 | Chini et al. |
| 2007/0246713 A1 | 10/2007 | Arnold et al. |
| 2007/0292999 A1 | 12/2007 | Henning et al. |
| 2008/0315257 A1 | 12/2008 | Shiraishi |
| 2009/0120924 A1 | 5/2009 | Moffatt et al. |
| 2010/0084742 A1 | 4/2010 | Sazawa et al. |
| 2011/0215338 A1 | 9/2011 | Zhang |
| 2011/0260174 A1 | 10/2011 | Hebert |
| 2012/0068227 A1 | 3/2012 | Hikita et al. |
| 2012/0153300 A1 | 6/2012 | Lidow et al. |
| 2012/0187451 A1 | 7/2012 | Saito |
| 2012/0217511 A1 | 8/2012 | Renaud et al. |
| 2012/0319127 A1 | 12/2012 | Chowdhury |
| 2013/0049014 A1 | 2/2013 | Aigo et al. |
| 2013/0062671 A1 | 3/2013 | Saito et al. |
| 2013/0153967 A1 | 6/2013 | Curatola |
| 2013/0221320 A1 | 8/2013 | Li et al. |
| 2014/0117381 A1 | 5/2014 | Kang et al. |
| 2014/0253241 A1 | 9/2014 | Lee et al. |
| 2014/0264379 A1 | 9/2014 | Kub et al. |
| 2014/0264960 A1 | 9/2014 | Ring et al. |
| 2015/0028345 A1 | 1/2015 | Wong et al. |
| 2015/0028350 A1 | 1/2015 | Suvorov et al. |
| 2015/0145032 A1 | 5/2015 | Quay et al. |
| 2015/0236146 A1 | 8/2015 | Liu et al. |
| 2015/0318387 A1 | 11/2015 | Chiu et al. |
| 2015/0349117 A1 | 12/2015 | Chu et al. |
| 2015/0372124 A1 | 12/2015 | Isobe et al. |
| 2016/0035870 A1 | 2/2016 | Wu et al. |
| 2016/0071967 A1 | 3/2016 | Prechtl et al. |
| 2016/0086878 A1 | 3/2016 | Otremba et al. |
| 2016/0293709 A1 | 10/2016 | Nakayama et al. |
| 2016/0351567 A1 | 12/2016 | Schmid |
| 2017/0018638 A1 | 1/2017 | Teo et al. |
| 2017/0033210 A1 | 2/2017 | Curatola et al. |
| 2017/0244407 A1 | 8/2017 | Prechtl et al. |
| 2017/0250273 A1 | 8/2017 | Schultz et al. |
| 2017/0365702 A1 | 12/2017 | Prechtl et al. |
| 2017/0373176 A1* | 12/2017 | Sriram ............ H01L 29/66431 |
| 2017/0373178 A1 | 12/2017 | Sriram et al. |
| 2019/0237569 A1 | 8/2019 | Sriram et al. |
| 2020/0219987 A1 | 7/2020 | Lee et al. |
| 2020/0357907 A1* | 11/2020 | Udrea ................ H01L 27/0605 |
| 2021/0126120 A1 | 4/2021 | Piedra et al. |

FOREIGN PATENT DOCUMENTS

| | | |
|---|---|---|
| CN | 103178108 A | 6/2013 |
| CN | 103329256 A | 9/2013 |
| CN | 105405877 A | 3/2016 |
| EP | 3276670 A1 | 1/2018 |
| JP | 2002-076024 A | 3/2002 |
| JP | 2006-507683 A | 3/2006 |
| JP | 2012-156320 A | 8/2012 |
| JP | 2012-231002 A | 11/2012 |
| JP | 2012-238751 A | 12/2012 |
| JP | 2013-106022 A | 5/2013 |
| JP | 2013-131755 A | 7/2013 |
| JP | 2014-504013 A | 2/2014 |
| JP | 2014-520405 A | 8/2014 |
| JP | 2017-059786 A | 3/2017 |
| JP | 2019-091757 A | 6/2019 |
| JP | 2019-519121 A | 7/2019 |
| WO | WO 2015/013620 A1 | 1/2015 |
| WO | WO 2017/223403 A1 | 12/2017 |

OTHER PUBLICATIONS

Shailaja P. Rao, "Implant Annealing of al dopants in silicon carbide using silane overpressure", Scholar Commons, University of South Florida, 2005, pp. 21-22; Retrieved from http://scholarscommons.usf.edu/cgi/viewcontent.cgiarticle=1828 context=e-td on Aug. 28, 2017 [Cited in related U.S. Appl. No. 15/424,209 and U.S. Appl. No. 15/192,545].

Wendt et al., "FIB Milling and Canneling" Nov. 1, 2008, Figure 1, p. 1; Retrieved from http://www.imaging-git.com/science/scanning-probe-microscopy/fib-milling-- - and-canneling on Aug. 28, 2017 [Cited in related U.S. Appl. No. 15/424,209 and U.S. Appl. No. 15/192,545].

Danielsson et al., "Fabrication and Characterization of Heterojunction Diodes with HVPE-Grown GaN on 4H—SiC" IEEE Transactions on Electron Devices, vol. 48, No. 3, Mar. 2001, pp. 444-449 [Cited in related U.S. Appl. No. 15/424,209 and U.S. Appl. No. 15/192,545].

Pal et al. "High electron Mobility transistor (HEMT)" IJSRET, vol. 1, Issue. 1, Mar. 2012, pp. 043-046 (Year: 2012) [Cited in related U.S. Appl. No. 15/192,545].

International Search Report and Written Opinion dated Sep. 21, 2007 for PCT/US2017/38937, filed Jun. 23, 2017.; 13 pages.

Final Office Action issued in U.S. Appl. No. 15/192,545, dated Apr. 12, 2018; 21 pages.

Kayali et al., "GaAs MMI C Reliability Assurance Guideline forSpace Applications" JPL Publication 96-25, Nat'l Aeronautics and Space Administration, Dec. 15, 1996, 221 pages.

International Patent Application No. PCT/US2022/028963; Int'l Search Report and the Written Opinion; dated Sep. 1, 2022; 12 pages.

European Patent Application No. 20749178.8; Partial Search Report; dated Sep. 28, 2022; 10 pages.

(56) References Cited

OTHER PUBLICATIONS

Chiu et al.; "Analysis of the Back-Gate Effect in Normally OFF p-GaN Gate High-Electron Mobility Transistor"; IEEE Transactions on Electron Devices; vol. 62 No. 2; Feb. 2015; p. 507-511.
European Patent Application No. 20749178.8; Extended Search Report; dated Feb. 2, 2023; 11 pages.
International Search Report and Written Opinion issued in PCT/US2020/015331, dated Mar. 4, 2020; 8 pages.
Sun et al.; "Impact of Traps on the Adjacent Channel Power Ratios of GaN HEMTs"; IEEE Electron Device Letters; vol. 41 No. 6; Jun. 2020; p. 816-819.
International Patent Application No. PCT/US2022/18489; Int'l Search Report and the Written Opinion; dated May 23, 2022; 22 pages.
International Patent Application No. PCT/US2022/13085; Int'l Search Report and the Written Opinion; dated Jun. 28, 2022; 21 pages.

\* cited by examiner

CIRCUITS AND GROUP III-NITRIDE HIGH-ELECTRON MOBILITY TRANSISTORS WITH BURIED P-TYPE LAYERS IMPROVING OVERLOAD RECOVERY AND PROCESS FOR IMPLEMENTING THE SAME

FIELD OF THE DISCLOSURE

The disclosure relates to microelectronic devices and more particularly to circuits and gallium nitride high-electron mobility transistors with buried p-type layers improving overload recovery. The disclosure also relates to a process of implementing microelectronic devices and more particularly to a process of implementing circuits and gallium nitride high-electron mobility transistors with buried p-type layers improving overload recovery.

BACKGROUND OF THE DISCLOSURE

Group III-Nitride based or gallium nitride (GaN) based high-electron mobility transistors (HEMTs) are very promising candidates for high power radio frequency (RF) applications, both in discrete and MMIC (Monolithic Microwave Integrated Circuit) forms. Current GaN HEMT designs use buffer layers that include traps to achieve desired breakdown. However, these traps cause memory effects that adversely affect performance. In particular, these designs show some trapping associated with what is called a "lag effect."

Additionally, in some radio frequency (RF) applications, such as receivers, using amplifiers implementing, for example, a high-electron mobility transistor (HEMT), a large signal can occur at the amplifier input (overload) due to a transmitter operating near the receiver or some other cause. When this occurs, a negative peak voltage at a gate of the high-electron mobility transistor (HEMT) can exceed a particular negative level and induce gate-lag trapping effects. In addition, various implementations of self-protection circuitry in some radio frequency (RF) applications implementing, for example, a high-electron mobility transistor (HEMT), can likewise generate a negative peak voltage (overload) at a gate of the high-electron mobility transistor (HEMT) that can exceed a particular negative level and induce gate-lag trapping effects. Moreover, other external and/or internal events can likewise generate a negative peak voltage (overload) at a gate of the high-electron mobility transistor (HEMT) that can exceed a particular negative level and induce gate-lag trapping effects. Consequently, this overload can present operational issues affecting operation of the high-electron mobility transistor (HEMT). In particular, a time required for the radiofrequency (RF) application to resume normal operation, also known as recovery time, can be unacceptably large. Moreover, the RF application may experience slower response, sluggish response, loss of gain and sensitivity, distortion, and/or the like after the overload is removed.

Accordingly, there is a need for a solution to addressing negative performance issues, such as overload, negative gate voltages, slower response, sluggish response, loss of gain and sensitivity, distortion, gate-lag trapping effects, gate lag, drain lag, overall lag and/or the like in Group-III nitride HEMTs and improving the performance of such devices.

SUMMARY OF THE DISCLOSURE

One general aspect includes an apparatus that includes a substrate; a group Ill-Nitride barrier layer; a source electrically coupled to the group III-Nitride barrier layer; a gate on the group III-Nitride barrier layer; a drain electrically coupled to the group III-Nitride barrier layer; a p-region being arranged at or below the group III-Nitride barrier layer; and a recovery enhancement circuit configured to reduce an impact of an overload received by the gate, where at least a portion of the p-region is arranged vertically below at least one of the following: the source, the gate, an area between the gate and the drain.

One general aspect includes a method of making a device that includes providing a substrate; providing a group III-Nitride barrier layer; electrically coupling a source to the group III-Nitride barrier layer; arranging a gate on the group III-Nitride barrier layer; electrically coupling a drain to the group III-Nitride barrier layer; configuring a recovery enhancement circuit to reduce an impact of an overload received by the gate; and providing a p-region being arranged at or below the group III-Nitride barrier layer, where at least a portion of the p-region is arranged vertically below at least one of the following: the source, the gate, an area between the gate and the drain.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
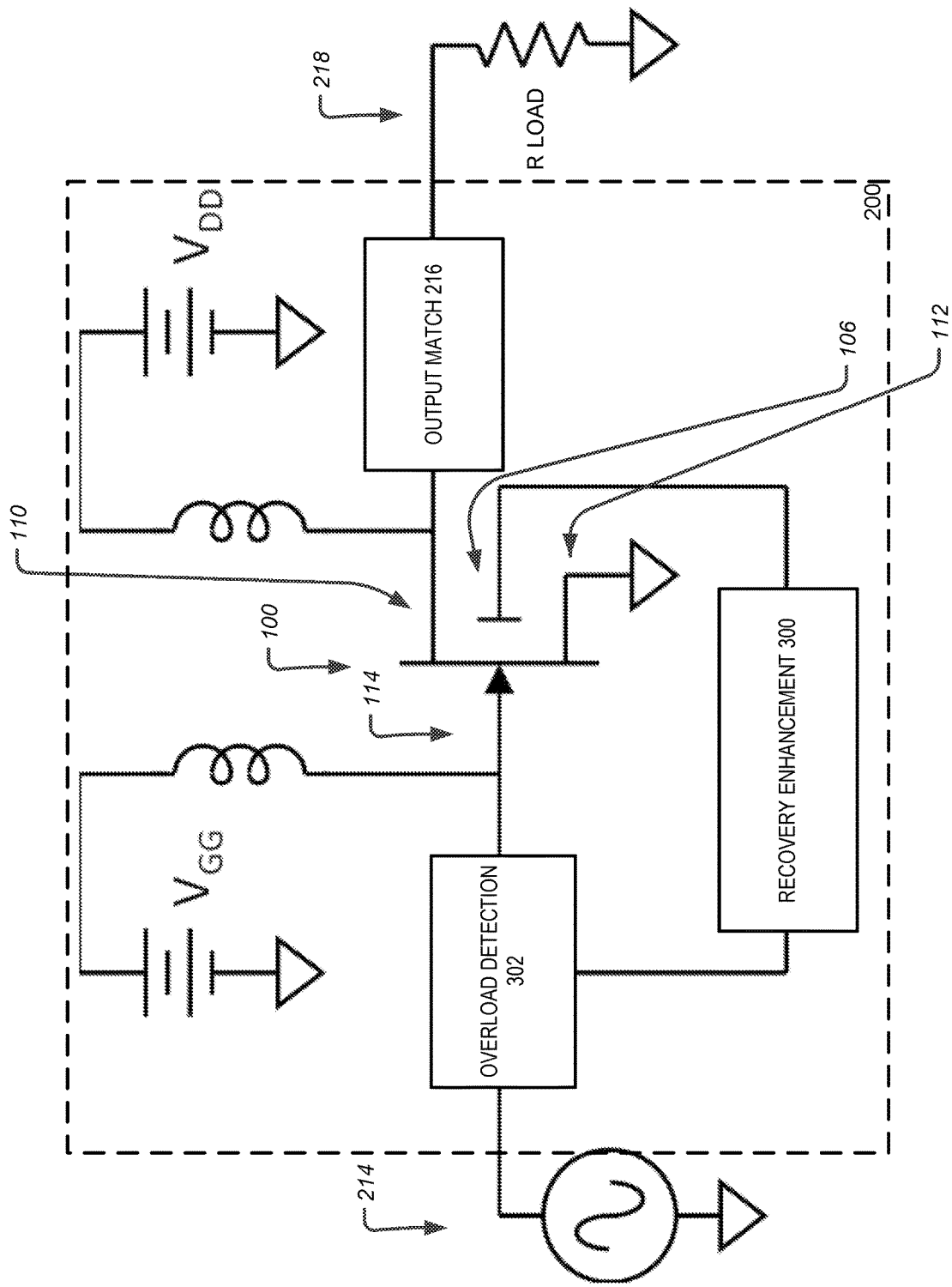
FIG. 1 illustrates a schematic circuit diagram for a transistor package according to an aspect of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different aspects disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the electron mobility, saturated electron drift velocity, electric breakdown field, and thermal conductivity may have an effect on a transistor's high frequency and high power characteristics.

Electron mobility is the measurement of how rapidly an electron is accelerated to its saturated velocity in the presence of an electric field. In the past, semiconductor materials, which had a high electron mobility, were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller ones.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties, which should theoretically allow production of electronic devices that can operate at higher temperatures, higher power, and higher frequency than devices produced from silicon (Si) or gallium arsenide (GaAs) substrates. The high electric breakdown field of about 4×E6 V/cm, high saturated electron drift velocity of about 2.0×E7 cm/sec and high thermal conductivity of about 4.9 W/cm-° K indicate that SiC would be suitable for high frequency and high power applications. In some aspects the transistor of the disclosure comprises Si, GaAs or other suitable substrates.

GaN based HEMTs are very promising candidates for high power RF applications, both in discrete and MMIC forms. GaN HEMT designs may use buffer layers that include traps to achieve desired breakdown. However, these traps may cause memory effects that adversely affect performance. To overcome this limitation, structures with buried p layers may be utilized to enable obtaining breakdown with minimal trapping. These devices show reduction and/or elimination of drain lag effect and the part of trapping associated with that effect. However, they still show some trapping associated with what is called a "gate lag effect," particularly at high negative gate voltages.

In particular, according to the disclosure structures using buried p layers may be utilized to reduce trapping in GaN HEMTs. These have been shown to reduce and/or eliminate drain lag associated trapping and also reduce and/or eliminate gate lag trapping up to certain levels of reverse bias on the gate. For example, in some applications up to about −8V (volts) reverse bias on the gate. However, it is been found that gate lag trapping effects may occur when the gate voltage drops below the certain levels. For example, in some applications below −8V reverse bias on the gate. This is undesirable and needs to be reduced or eliminated.

Additionally, in some radiofrequency (RF) applications, such as receivers, using amplifiers implementing, for example, a high-electron mobility transistor (HEMT), a large signal can occur at the amplifier input due to a transmitter operating near the receiver or some other cause. For example, radiofrequency (RF) applications using low noise amplifiers. When this occurs, a negative peak voltage at a gate of the high-electron mobility transistor (HEMT) can exceed a particular negative level and induce gate-lag trapping effects, gate lag, drain lag, overall lag, and/or the like. For example, in some applications below −8V reverse bias on the gate. Moreover, the RF application may experience slower response, sluggish response, loss of gain and sensitivity, distortion, and/or the like.

In addition, various implementations of self-protection circuitry, such as low noise amplifier (LNA) self-protection circuitry in some radio frequency (RF) applications implementing, for example, a high-electron mobility transistor (HEMT), can likewise generate a negative peak voltage at a gate of the high-electron mobility transistor (HEMT) that can exceed a particular negative level and induce gate-lag trapping effects, gate lag, drain lag, overall lag, and/or the like. For example, in some applications below −8V reverse bias on the gate. Moreover, the RF application may experience slower response, sluggish response, loss of gain and sensitivity, distortion, and/or the like.

In certain implementations, this may result in an RF overdrive that may shift a DC bias of the HEMT gate to a negative value, such as −8V for certain applications, for the duration of the overload signal. Moreover, other external and/or internal events can likewise generate a negative peak voltage (overload) at a gate of a transistor such as a high-electron mobility transistor (HEMT) that can exceed a particular negative level and induce gate-lag trapping effects, gate lag, drain lag, overall lag, and/or the like. Moreover, the transistor may experience slower response, sluggish response, loss of gain and sensitivity, distortion, and/or the like.

Consequently, this overload can present operational issues affecting operation of the transistor 100 and/or the transistor package 200. Moreover, a time required for the transistor 100 and/or the transistor package 200 to resume normal operation, also known as recovery time, can be unacceptably large.

The disclosure is directed to circuits and/or processes for reducing the recovery time by interaction with the buried-p layer, to reduce or mitigate trap energy concentration. For example, a constant bias (other than zero volts), a dynamic signal, a time varying signal, and/or the like may be used to reduce the gate-lag effect, to reduce charge trapping, and/or the like in response to an overvoltage condition. The disclosed circuits and/or processes may prevent and/or reduce charge accumulation in the traps of the device.

For example, the disclosure may provide a contact, a pad, a contact pad, a transistor control pad, a HEMT control pad, and/or the like to the buried p-layer within a transistor. This contact, pad, contact pad, transistor control pad, HEMT control pad and/or the like may permit the addition of a bias voltage, dynamic electrical pulse, and/or the like to enhance recovery time. Accordingly, when an overdrive condition occurs that causes negative peak voltages below the allowable threshold and forces unwanted charge storage in the HEMT, an overload detection circuit, which may or may not directly involve the RF signal path, may detect this condition and trigger a suitable response in a recovery enhancement circuit. When the overdrive condition is removed, the overload detection circuit may send a signal to trigger a recovery enhancement circuit which generates a suitable signal to the contact, pad, contact pad, transistor control pad, HEMT control pad and/or the like for resetting the charge storage in the transistor, such as a HEMT.

Additionally, a buried p layer is used in the implementations of the disclosure to reduce and/or eliminate drain lag and/or gate lag. In addition, the disclosure implements circuits and/or processes to control the charge trapping in the device and improve recovery time. Additionally, the proposed circuits and/or process can be used in GaN discrete HEMTs, MMICs, and/or the like for use in commercial applications, defense applications, and/or the like. The combination of a buried p layer together with the disclosed circuits and/or processes to control the charge trapping in the device improves recovery time and/or the like.

Moreover, a buried p layer may be used in the implementations of the disclosure to reduce and/or eliminate drain lag and/or gate lag; and the disclosure implements circuits and/or processes to control the charge trapping in the device and improve recovery time, which may provide substantial improvement in the performance of a receiver application such as HEMT receiver application, a low noise GaN receiver application, and/or the like operating in adverse environments. Additionally, a buried p layer to reduce and/or eliminate drain lag and/or gate lag; and the circuits and/or processes to control the charge trapping in the device may improve recovery time and may also provide improvement of memory effects in High Power Amplifier (HPA) circuits with digital modulation, to reduce the burden on digital predistortion techniques.

FIG. 1 illustrates a schematic circuit diagram for a transistor package according to an aspect of the disclosure.

In particular, FIG. 1 illustrates a schematic circuit diagram for a transistor package 200 that may include a transistor 100 and an output matching network 216. The transistor 100 may include a gate 114, a drain 112, and a source 110. In various aspects, the transistor package 200 may be implemented as a radiofrequency package, an amplifier package, and/or the like. Additionally, the transistor package 200 and/or the transistor 100 illustrated in FIG. 1 may include any one or more the features disclosed herein.

In the transistor package 200 and/or the transistor 100, overload can be a problematic side effect that may be detrimental to the performance and/or operation of the transistor 100. The overload may be a high voltage level, a high current level, a high voltage level signal, a high current level signal, and/or the like. For example, the transistor 100 and/or the transistor package 200 in some radiofrequency (RF) applications, such as receiver applications, using amplifiers implementing the transistor 100, may receive a large signal at an input. This may be from a transmitter operating near the transistor 100 and/or the transistor package 200 or some other cause. For example, the transistor 100 and/or the transistor package 200 may be implementing radiofrequency (RF) applications using low noise amplifiers. In this regard, a large signal may be a signal having a voltage level, a current level, and/or the like greater than 100% an average signal level, greater than 400% an average signal level, greater than 600% an average signal level, greater than 800% an average signal level, or greater than 1000% an average signal level. Moreover, a large signal may be a signal having a voltage level, a current level, and/or the like greater than 100%-400% an average signal level, greater than 400%-600% an average signal level, greater than 600%-800% an average signal level, or greater than 800%-1000% an average signal level. When this occurs, a negative peak voltage at the gate 114 of the transistor 100 can exceed a particular negative level and induce gate-lag trapping effects, gate lag, drain lag, overall lag, and/or the like. For example, in some applications below −8V reverse bias on the gate. Moreover, the transistor 100 may experience slower response, sluggish response, loss of gain and sensitivity, distortion, and/or the like.

In addition, various implementations of self-protection circuitry, such as a low noise amplifier (LNA) self-protection circuitry in some radiofrequency (RF) applications implementing the transistor 100 and/or the transistor package 200 can likewise generate a negative peak voltage at the gate 114 of the transistor 100 that can exceed a particular negative level and induce gate-lag trapping effects, gate lag, drain lag, overall lag, and/or the like. For example, in some applications below −8V reverse bias on the gate. Moreover, the transistor 100 may experience slower response, sluggish response, loss of gain and sensitivity, distortion, and/or the like. In certain implementations, this may result in an RF overdrive that may shift a DC bias of the gate 114 of the transistor 100 to a negative value, such as −8 volts for certain applications, for the duration of the overload signal. Here again, the transistor 100 may experience slower response, sluggish response, loss of gain and sensitivity, distortion, and/or the like.

Moreover, other external and/or internal events can likewise generate a negative peak voltage (overload) at the gate 114 of the transistor 100 that can exceed a particular negative level and induce gate-lag trapping effects, gate lag, drain lag, overall lag, and/or the like. Likewise, the transistor 100 may experience slower response, sluggish response, loss of gain and sensitivity, distortion, and/or the like.

Consequently, this overload, irrespective of its source, can present operational issues affecting operation of the transistor 100 and/or the transistor package 200. Moreover, a time required for the radiofrequency (RF) application of the transistor package 200 to resume normal operation, also known as recovery time, can be unacceptably large.

In particular, the overload of the transistor 100 and/or the transistor package 200 may result in lag of the transistor 100 that can be a problematic side effect that is detrimental to the performance and/or operation of the transistor package 200 and/or the transistor 100. Lag may be presented as a drain lag and/or a gate lag. Lag can impact performance of the transistor package 200 and/or the transistor 100 and may include slower response, sluggish response, loss of gain and sensitivity, distortion, and/or the like. Moreover, lag may present with a larger impact to the transistor package 200 and/or the transistor 100 when implemented as an amplifier due to the transient nature of the various input and output signals from the transistor 100.

The disclosure presents a number of structural implementations to the transistor 100 that reduce the drain lag and/or reduces the gate lag as further described herein. However, these structural implementations to reduce drain lag of the transistor 100 may in some applications result in presenting gate lag to be a greater issue impacting performance of the transistor 100. For example, these structural implementations to reduce drain lag in the transistor 100 may in some applications detrimentally impact gate lag, increase the impact of gate lag, increase gate lag, and/or the like. In particular, where the gate voltage drops below −8V in certain transistor applications may result in an increase in impact of gate lag, increase gate lag, increase in gate lag trapping effects, and/or the like. For other applications, where voltage at the gate 114 drops below other negative voltage values may result in an increase in impact of gate lag, increase gate lag, increase in gate lag trapping effects, and/or the like.

Additionally, the disclosure further presents a configuration with the transistor package 200 and/or the transistor 100, which may be implemented as a recovery enhancement circuit 300 to reduce an impact of the overload, reduce recovery time, reduce a gate lag, reduce an impact of gate lag, reduce an increase of gate lag, reduce gate lag trapping effects, and/or the like of the transistor 100. In particular, the recovery enhancement circuit 300 may be responsive to an overload detection circuit 302.

The overload detection circuit 302 may detect an overload and thereafter operate the recovery enhancement circuit 300 to reset the transistor package 200 and/or the transistor 100. More specifically, the overload detection circuit 302 may be arranged between the RF signal input lead 214 and the gate 114 to detect a high voltage level, a high current level, a high voltage level signal, a high current level signal, and/or the like being applied to the transistor 100 and in particular the gate 114. Alternatively, the overload detection circuit 302 may be connected to a line between the RF signal input lead 214 and the gate 114 to detect a high voltage level, a high current level, a high voltage level signal, a high current level signal, and/or the like being applied to the transistor 100 and in particular the gate 114. Thereafter, the overload detection circuit 302 may detect when there is no longer a high voltage level, a high current level, a high voltage level signal, a high current level signal, and/or the like being applied to the transistor 100 and in particular the gate 114. Once a high voltage level, a high current level, a high voltage level signal, a high current level signal, and/or the like being applied to the transistor 100 and in particular the gate 114 has subsided, the overload detection circuit 302 may initiate operation of the recovery enhancement circuit 300. Operation of the recovery enhancement circuit 300 may provide a bias voltage, a dynamic electrical pulse, and/or the like to the transistor 100. In particular, operation of the recovery enhancement circuit 300 may provide a bias voltage, a dynamic electrical pulse, and/or the like to a p-type material layer 106 of the transistor 100. In this regard, operation of the recovery enhancement circuit 300 in response to the overload detection circuit 302 may reduce an impact of the overload, reduce recovery time, reduce a gate lag, reduce an impact of gate lag, reduce an increase of gate lag, reduce gate lag trapping effects, and/or the like of the transistor 100.

In one or more aspects, the overload detection circuit 302 may include one or more transistors, one or more resistors, one or more capacitors, one or more inductors, and/or the like. In one or more aspects, the overload detection circuit 302 may include circuitry to detect a high voltage level, a high current level, a high voltage level signal, a high current level signal, and/or the like being applied to the transistor 100. The overload detection circuit 302 may include one or more voltage sensors, one or more current sensors, one or more comparators, and/or the like. In one or more aspects, the overload detection circuit 302 may include circuitry to detect a high voltage level, a high current level, a high voltage level signal, a high current level signal, and/or the like exceeding a threshold value being applied to the transistor 100.

In one or more aspects, the recovery enhancement circuit 300 may include one or more transistors, one or more resistors, one or more capacitors, one or more inductors, and/or the like. In one or more aspects, the recovery enhancement circuit 300 may include one or more signal sources, one or more signal generators, and/or the like. In one or more aspects, the recovery enhancement circuit 300 may include a bias voltage source, a bias voltage generator, and/or the like. In one or more aspects, the recovery enhancement circuit 300 may include a dynamic electrical pulse source, a dynamic electrical pulse generator, and/or the like. Although FIG. 1 illustrates that the overload detection circuit 302 and the recovery enhancement circuit 300 are separate components, the disclosure additionally contemplates that the overload detection circuit 302 and 300 may be a single combined component.

Additionally, the transistor 100 may be configured with a contact to the p-type material layer 106 within the transistor 100. The contact may permit the recovery enhancement circuit 300 to provide a bias voltage, a dynamic electrical pulse, and/or the like to the transistor 100 to enhance recovery time of the transistor 100. In this regard, once a high voltage level, a high current level, a high voltage level signal, a high current level signal, and/or the like being applied to the transistor 100 and in particular the gate 114 has subsided, the overload detection circuit 302 may initiate operation of the recovery enhancement circuit 300 to provide a bias voltage, a dynamic electrical pulse, and/or the like to the transistor 100, and in particular, the p-type material layer 106 of the transistor 100 to enhance recovery time, reduce an impact of the overload, reduce recovery time, reduce a gate lag, reduce an impact of gate lag, reduce an increase of gate lag, reduce gate lag trapping effects, and/or the like of the transistor 100.

In other words, when an overdrive condition occurs that causes negative peak voltages below an allowable threshold at the gate 114 and forces unwanted charge storage in the transistor 100, the overload detection circuit 302, which may or may not directly involve the RF signal path, may detect this condition and trigger a suitable response in the recovery enhancement circuit 300. In particular, when the overdrive condition is removed, the overload detection circuit 302 may send a signal to trigger operation of the recovery enhancement circuit 300, which generates a suitable signal to the p-type material layer 106 for resetting the charge storage in the transistor 100. Additionally or alternatively, when the overdrive condition is removed, the overload detection circuit 302 may send a signal to trigger operation of the recovery enhancement circuit 300, which generates and provides a suitable signal to the gate 114 and/or the like for resetting the charge storage in the transistor 100. Additionally or alternatively, when the overdrive condition is removed, the overload detection circuit 302 may send a signal to trigger operation of the recovery enhancement circuit 300, which generates and provides a suitable signal to the drain 112 and/or the like for resetting the charge storage in the transistor 100.

Additionally, the transistor 100 and/or the transistor package 200 may include an output terminal that may be the drain 112. The output terminal of the transistor 100 of the transistor package 200 may be connected to an RF output lead 218 through the output matching network 216. The output matching network 216 may include one or more inductances, impedances, capacitors, and/or the like connected between the RF output lead 218 and the source 110 of the transistor 100. In some aspects, the output matching network 216 may include a plurality of output matching circuits, each of which may include one or more inductances, impedances, capacitors, and/or the like connected between the RF output lead 218 and the source 110 of the transistor 100.

Figure 2:
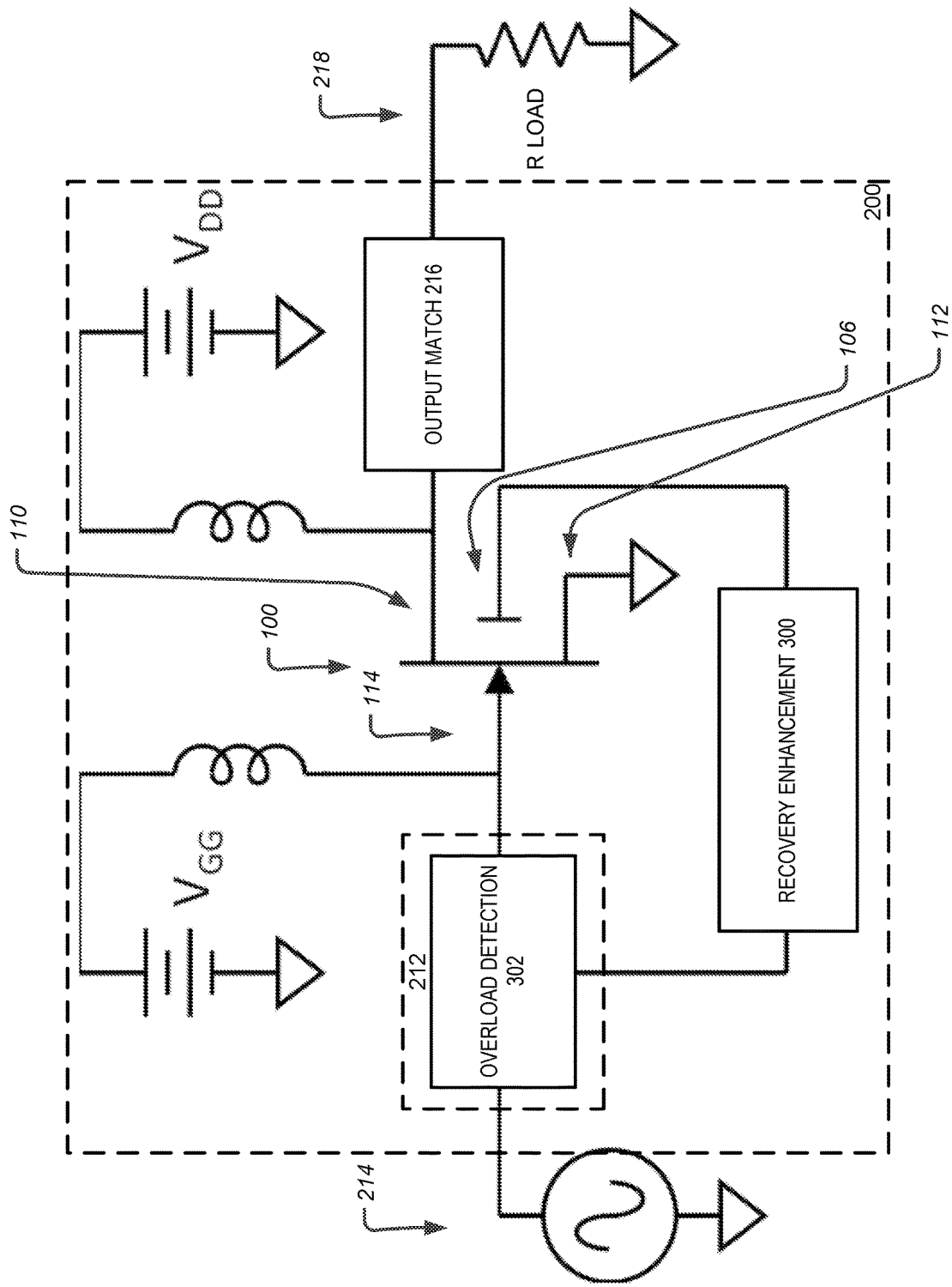
FIG. 2 illustrates a schematic circuit diagram for a package according to an aspect of the disclosure according to FIG. 1.

FIG. 2 illustrates a schematic circuit diagram for a package according to an aspect of the disclosure according to FIG. 1.

In particular, the transistor package 200 and/or the transistor 100 illustrated in FIG. 2 may include any one or more the features disclosed herein. Additionally, FIG. 2 illustrates a schematic circuit diagram for a transistor package 200 that may include an input matching network 212. In one aspect, the recovery enhancement circuit 300 may be connected between the input matching network 212 and the gate 114 of the transistor 100. In one aspect, the recovery enhancement circuit 300 may be implemented and arranged within and/or as part of the input matching network 212. In one aspect, the recovery enhancement circuit 300 may be connected between the input matching network 212 and an RF signal input lead 214 of the transistor 100.

The input matching network 212 may include one or more inductances, impedances, capacitors, and/or the like connected between the RF signal input lead 214 and the transistor 100. In some aspects, the input matching network 212 may include a plurality of input matching circuits, each of which may include one or more inductances, impedances, capacitors, and/or the like connected between the RF signal input lead 214 and the transistor 100. The input matching network 212 and the output matching network 216 may be configured increase the usable bandwidth of the device and/or the like.

Figure 3:
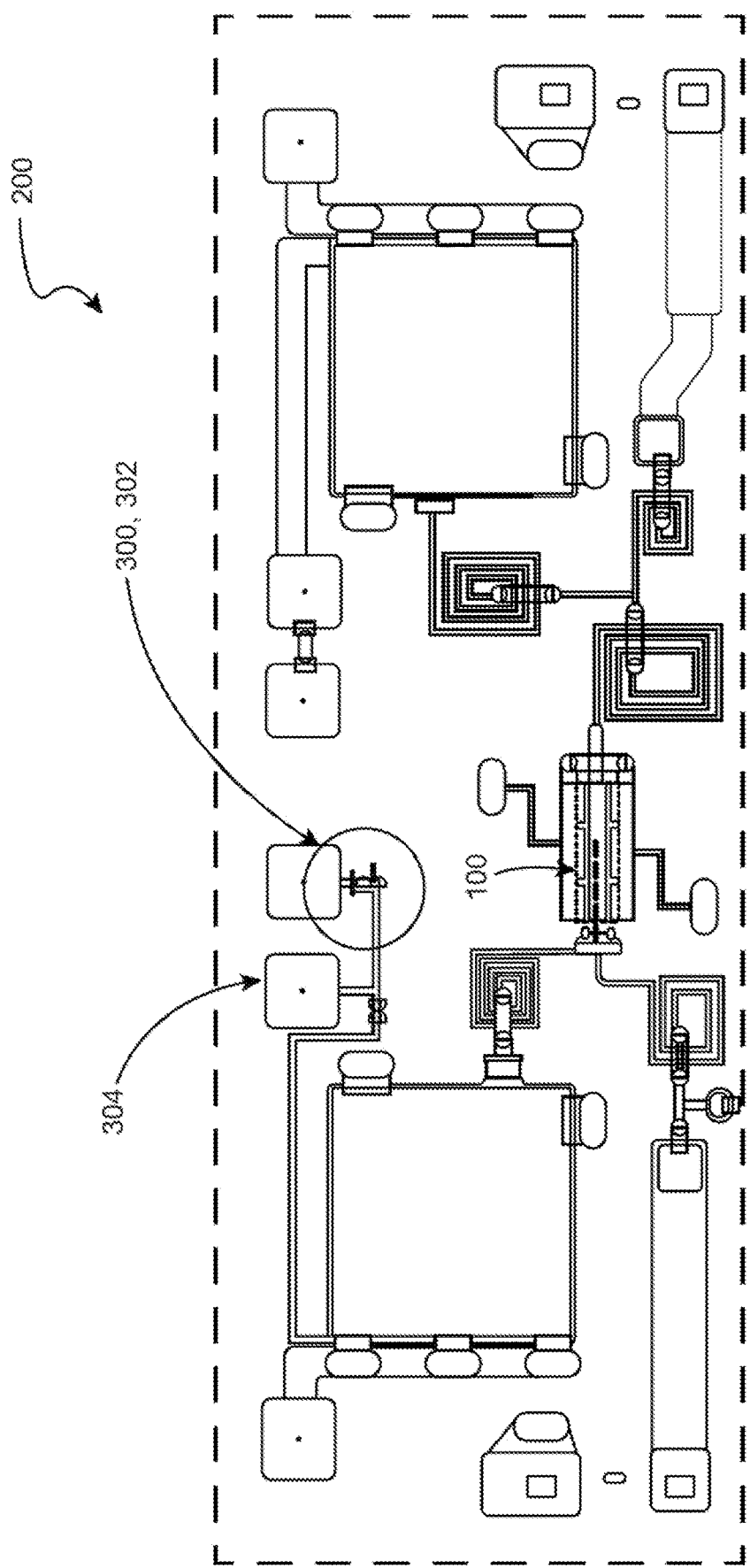
FIG. 3 illustrates a top view of a package according to an aspect of the disclosure according to FIG. 1.

FIG. 3 illustrates a top view of a package according to an aspect of the disclosure according to FIG. 1.

In particular, the transistor package 200 and/or the transistor 100 illustrated in FIG. 3 may include any one or more the features disclosed herein. Additionally, FIG. 3 illustrates the transistor package 200 implementing the transistor 100 as a low noise amplifier HEMT. Additionally, the transistor package 200 may include the recovery enhancement circuit 300 and the overload detection circuit 302. In one aspect, the transistor package 200 may further include a gate bias input pad 304.

Figure 4:
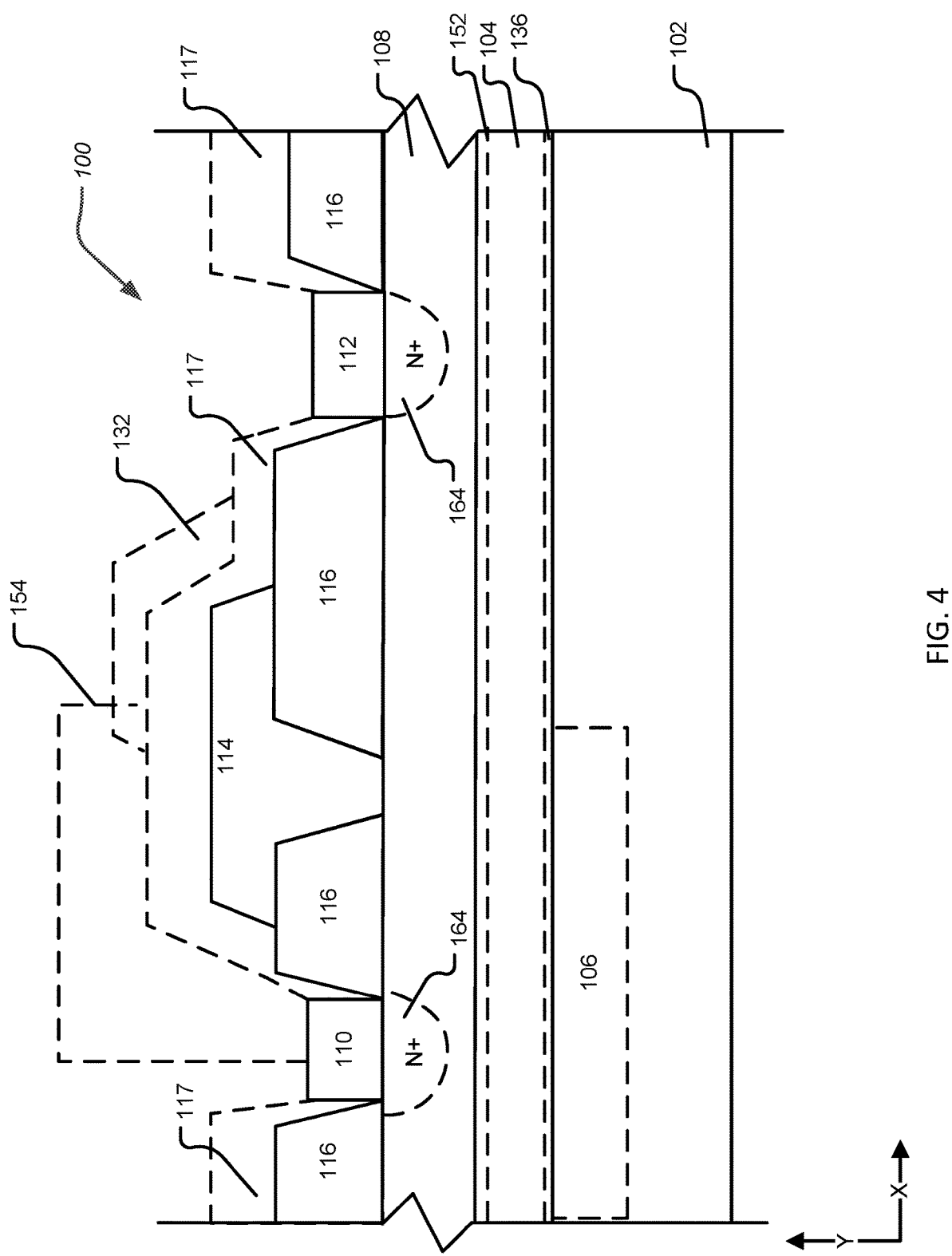
FIG. 4 shows a cross-sectional view of an aspect of a transistor according to the disclosure.

FIG. 4 shows a cross-sectional view of an aspect of a transistor according to the disclosure.

In particular, FIG. 4 shows a cross-sectional view of a transistor 100. More specifically, the transistor 100 described in detail herein may be utilized in conjunction with the transistor package 200, the overload detection circuit 302, the recovery enhancement circuit 300 and/or the like as described above. As further described below, the transistor 100 includes structures and configurations to reduce overall lag of the transistor 100 including drain lag and gate lag in conjunction with a buried p-region or p-type material layer.

The transistor 100 may include a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. In one aspect, the substrate layer 102 may be formed of SiC selected from the group of 6H, 4H, 15R, 3C SiC, or the like. In one aspect, the substrate layer 102 may be formed of SiC that may be semi-insulating and doped with vanadium or any other suitable dopant or undoped of high purity with defects providing the semi-insulating properties.

In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials. In particular aspects, the substrate layer 102 may include a planer upper surface that is generally parallel to an X axis as illustrated in FIG. 4 and/or is generally parallel to an Z axis (perpendicular to the X axis and the Y axis). In particular aspects, the substrate layer 102 may include a planer lower surface that is generally parallel to an X axis as illustrated in FIG. 4 and/or is generally parallel to an Z axis (perpendicular to the X axis and the Y axis). Where upper and lower are defined along the Y axis.

The transistor 100 may include a buried p-region or p-type material layer 106 that may be formed within the substrate layer 102. The p-type material layer 106 may be provided solely in the substrate layer 102, extend from the substrate layer 102 to epitaxial layers within the transistor 100, or located solely in the epitaxial layers of the transistor 100. The dopants can be incorporated into the epitaxial layers by ion implantation alone, through epitaxial growth, or a combination of both. The p-type material layer 106 can span multiple layers and include multiple areas of different or graded p-doping. In accordance with other aspects of the disclosure, the p-type material layer 106 may also be formed below the barrier layer 108 between the barrier layer 108 and the substrate layer 102 and/or within the substrate layer 102.

In accordance with aspects of the disclosure, at least some portions of the substrate layer 102 may include the p-type material layer 106. In accordance with aspects of the disclosure, the p-type material layer 106 may be formed by ion implantation of aluminum (Al) and annealing. In other aspects, the p-type material layer 106 may be formed by ion implantation of boron, gallium, or any other material that may form a p-type layer or a combination of these. In one aspect, the p-type material layer 106 may be formed by implantation and annealing of Al prior to the growth of any GaN layers. In one aspect, the ion implementation may utilize channeling implants. In one aspect, the channeling implants may include aligning the ion beam to the substrate layer 102. Alignment of the ion beam may result in increased implanting efficiency. In other aspects, the ion implantation may not utilize channeling.

Aspects of the disclosure may utilize implant channeling to controllably form implanted regions of the p-type material layer 106 in silicon carbide implementations of the substrate layer 102 that are highly uniform by depth and also result in reduced lattice damage. Channeling is experienced when ions are implanted along a crystal axis of the substrate layer 102. When a direction of implantation is close to a major axis of the crystal lattice, the atoms in the crystal lattice appear to "line up" relative to the direction of implantation, and the implanted ions appear to travel down the channels created by the crystal structure to form the p-type material layer 106. This reduces the likelihood of collisions between the implanted ions and the atoms in the crystal lattice. As a result, the depth of the implant of the p-type material layer 106 may be greatly increased.

In general, channeling occurs in silicon carbide when the direction of implantation is within about ±0.2° of a crystallographic axis of the silicon carbide crystal. In some aspects, the implantation may be greater than ±0.2° of the crystallographic axis of the silicon carbide crystal, however the implantation may be less effective. For example, when the direction of implantation is more than about ±0.2° of a crystallographic axis of the silicon carbide crystal, the atoms in the lattice may appear to be randomly distributed relative to the direction of implantation, which may reduce channeling effects. As used herein, the term "implant angle" refers to the angle between the direction of implantation and a crystallographic axis, such as the c-axis or <0001> axis, of the semiconductor layer into which ions are implanted. Thus, an implant angle of less than about 2° relative to the c-axis of a silicon carbide layer may be expected to result in channeling. However, other implant angles may be utilized as well.

In one aspect, the p-type material layer 106 may be formed by ion implantation of $^{27}Al$ in 4H-SiC implanted with channeling conditions with an implant energy of $E_1=100$ keV with a dose of $1E13$ $cm^2$ at 25° C. In one aspect, the p-type material layer 106 may be formed by ion implantation of $^{27}Al$ in 4H-SiC implanted with channeling conditions with an implant energy of $E_2=300$ keV with a dose of $1E13$ $cm^2$ at 25° C. However, other implant energies and doses are contemplated as well. For example, in some aspects the implant energy may be 20 keV to 80 keV, 80 keV to 120 keV, 120 keV to 160 keV, 160 keV to 200 keV, 200 keV to 240 keV, 240 keV to 280 keV, 280 keV to 340 keV, 340 keV to 400 keV, 20 keV to 400 keV, and/or 80 keV to 340 keV; and in some aspects the implant dose may be $0.6E13$ $cm^2$ to $0.8E13$ $cm^2$, $0.8E13$ $cm^2$ to $1.2E13$ $cm^2$, $1.2E13$ $cm^2$ to $1.6E13$ $cm^2$, $1.6E13$ $cm^2$ to $2E13$ $cm^2$, $0.6E13$ $cm^2$ to $2E13$ $cm^2$, and/or $0.8E13$ $cm^2$ to $1.2E13$ $cm^2$. Additionally, it should be noted that the p-type material layer 106 may be formed by implantation of other materials such as Boron (B), Gallium (Ga), and/or the like, and may be followed by a high temperature anneal.

In one aspect, the ion implantation may result in the p-type material layer 106 being a deep layer. In one aspect, the ion implantation may result in the p-type material layer 106 having a thickness of 1 µm or less. In one aspect, the ion implantation may result in the p-type material layer 106 having a thickness of 0.7 µm or less. In one aspect, the ion implantation may result in the p-type material layer 106 having a thickness of 0.5 µm or less. In one aspect, the ion implantation may result in the p-type material layer 106 having a thickness of 0.3 µm to 0.5 µm. In one aspect, the ion implantation may result in the p-type material layer 106 having a thickness of 0.2 µm to 0.6 µm. In one aspect, the ion implantation may result in the p-type material layer 106 having a thickness of 0.4 µm to 0.6 µm. In one aspect, the ion implantation may result in the p-type material layer 106 having a thickness of 0.6 µm to 0.8 µm. In one aspect, the ion implantation may result in the p-type material layer 106 having a thickness of 0.6 µm to 1.6 µm. In one aspect, the ion implantation may result in the p-type material layer 106 having a thickness of 0.6 µm to 2.1 µm. In one aspect, the ion implantation may result in the p-type material layer 106 having a thickness of 1 µm to 5 µm. In one aspect, the p-type material layer 106 implantation and/or doping may be in the range of 5E15 to 5E17 per $cm^3$ and extend to depths up to 5 µm.

In one aspect, the ion implantation may result in the p-type material layer 106 having a thickness of 0.5% to 0.3% of a thickness of the substrate layer 102. In one aspect, the ion implantation may result in the p-type material layer 106 having a thickness of 0.5% to 0.1% of a thickness of the substrate layer 102. In one aspect, the ion implantation may result in the p-type material layer 106 having a thickness of 0.1% to 0.15% of a thickness of the substrate layer 102. In one aspect, the ion implantation may result in the p-type material layer 106 having a thickness of 0.15% to 0.2% of a thickness of the substrate layer 102. In one aspect, the ion implantation may result in the p-type material layer 106 having a thickness of 0.2% to 0.25% of a thickness of the substrate layer 102. In one aspect, the ion implantation may result in the p-type material layer 106 having a thickness of 0.25% to 0.3% of a thickness of the substrate layer 102.

The p-type material layer 106 may be implanted within the substrate layer 102 and may be subsequently annealed. Annealing may allow for the implantation to be activated. In one aspect, a masking layer material may be utilized during implantation. In some aspects, during annealing of the p-type material layer 106, a cap layer material may be used to cover the wafer surface to prevent dissociation of the substrate at high temperatures. Once the p-type material layer 106 has been formed, the masking layer material may be removed. Annealing may be performed at a temperature range of 1500-1850° C. for 5 minutes-30 minutes. Other annealing time and temperature profiles are contemplated as well.

In some aspects, the substrate layer 102 may be made of a p-type material SiC substrate. Further in this aspect, the substrate layer 102 being a p-type material SiC substrate may be subsequently subjected to the processes as described herein including implantation of additional p-type layers. In aspects of the transistor 100 of the disclosure, the p-type material layer 106 may be neutralized to limit the length of the p-type material layer 106. In one aspect, neutralizing may include implantation of impurities. In one aspect, neutralizing the p-type material layer 106 may include absorbing the charge of the p-type material layer 106 with a material of opposite polarity. Another way to limit the length of the p-type material layer 106 may be to etch the p-type material layer 106. Another way to limit the length of the p-type material layer 106 may be to use a masking material to limit the area for implantation.

In aspects of the transistor 100 of the disclosure, the p-type material layer 106 may be formed by growing the p-type material layer 106. Growth may be epitaxial, for example. To limit the length of the p-type material layer 106, the p-type material layer 106 may be etched or otherwise neutralized. In aspects of the transistor 100 of the disclosure, the substrate layer 102 may be etched and the p-type material layer 106 may be formed by growing the p-type material layer 106. In one aspect, the growth may be epitaxial.

In aspects of the transistor 100 of the disclosure, the p-type material layer 106 may be an epitaxial layer and may be GaN. In some aspects, the p-type material layer 106 may be an epitaxial layer and may be GaN and the p-type material layer 106 may include magnesium (Mg), carbon (C), and/or Zinc. In some aspects, the p-type material layer 106 may be an epitaxial layer and may be GaN and the p-type material layer 106 may include implantation of magnesium (Mg), carbon (C), and/or Zinc.

In aspects of the transistor 100 of the disclosure, the substrate layer 102 may be etched and the p-type material layer 106 may be formed by growing the p-type material layer 106. In one aspect, the growth may be epitaxial.

In aspects of the transistor 100 of the disclosure, the p-type material layer 106 may be an epitaxial layer formed of SiC. In some aspects, the p-type material layer 106 may be an epitaxial layer and may be SiC and the p-type material layer 106 may include Al and/or Br. In some aspects, the p-type material layer 106 may be an epitaxial layer and may be SiC and the p-type material layer 106 may include implantation of Al and/or Br.

In some aspects, the p-type material layer 106 may be under 0.6 µm in thickness. In some aspects, the p-type material layer 106 may be under 0.5 µm in thickness. In some aspects, the p-type material layer 106 may be under 0.4 µm in thickness. In some aspects, the p-type material layer 106 may be under 0.3 µm in thickness. In some aspects, the p-type material layer 106 may be under 0.2 µm in thickness. In some aspects, the p-type material layer 106 may be between 0.1 and 0.6 µm in thickness. In some aspects, the p-type material layer 106 may be between 0.5 and 0.6 µm in thickness. In some aspects, the p-type material layer 106 may be between 0.4 and 0.5 µm in thickness. In some aspects, the p-type material layer 106 may be between 0.3 and 0.4 µm in thickness. In some aspects, the p-type material layer 106 may be between 0.2 and 0.3 µm in thickness. In some aspects, the p-type material layer 106 may be between 0.1 and 0.3 µm in thickness. In some aspects, the p-type material layer 106 may be between 0.5 and 0.25 µm in thickness. In some aspects, the p-type material layer 106 may be between 0.15 and 0.25 µm in thickness.

In aspects of the transistor 100 of the disclosure, the p-type material layer 106 may be a graded layer. In one aspect, the p-type material layer 106 may be a step-graded layer. In one aspect, the p-type material layer 106 may be multiple layers. In one aspect, the p-type material layer 106 may be a graded layer. In one aspect, the p-type material layer 106 may be a step-graded layer. In one aspect, the p-type material layer 106 may be multiple layers. In particular aspects, the p-type material layer 106 may include a planer upper surface that is generally parallel to an X axis as illustrated in FIG. 4 and/or is generally parallel to an Z axis (perpendicular to the X axis and the Y axis). In particular aspects, the p-type material layer 106 may include a planer lower surface that is generally parallel to an X axis as illustrated in FIG. 4 and/or is generally parallel to an Z axis (perpendicular to the X axis and the Y axis). Where upper and lower are defined along the Y axis. Depending on the material of the substrate layer 102, a nucleation layer 136 may be formed on the substrate layer 102 to reduce a lattice mismatch between the substrate layer 102 and a next layer in the transistor 100. In one aspect, the nucleation layer 136 may be formed directly on the substrate layer 102. In other aspects, the nucleation layer 136 may be formed on the substrate layer 102 with intervening layer(s), such as SiC epitaxial layer(s) formed on a SiC implementation of the substrate layer 102. The nucleation layer 136 may include different suitable materials, such as a Group III-Nitride material, e.g., $Al_xIn_{y1-x-y}GaN$ (where $0<=x<=1$, $0<=y<=1$, $x+y<=1$). The nucleation layer 136 may be formed on the substrate layer 102 using known semiconductor growth techniques such as Metal Oxide Chemical Vapor Deposition (MOCVD), Hydride Vapor Phase Epitaxy (HVPE), Molecular Beam Epitaxy (MBE), or the like. In some aspects, the nucleation layer is Aluminum Nitride (AlN) or Aluminum Gallium Nitride (AlGaN), such as undoped AlN or AlGaN.

In some aspects, a buffer layer 104 may be formed directly on the nucleation layer 136 or on the nucleation layer 136 with intervening layer(s). Depending on the aspect, the buffer layer 104 may be formed of different suitable materials such as a Group III-nitride such as $Al_xGa_yIn_{(1-x-y)}N$ (where $0<=x<=1$, $0<=y<=1$, $x+y<=1$), e.g., GaN, AlGaN, AlN, and the like, or another suitable material. In one aspect, the buffer layer 104 is formed of GaN. The buffer layer 104 or portions thereof may be doped with dopants, such as, Fe and/or C or alternatively can be wholly or partly undoped. In one aspect, the buffer layer 104 is directly on the substrate layer 102. In particular aspects, the buffer layer 104 may include a planer upper surface that is generally parallel to an X axis as illustrated in FIG. 4 and/or is generally parallel to an Z axis (perpendicular to the X axis and the Y axis). In particular aspects, the buffer layer 104 may include a planer lower surface that is generally parallel to an X axis as illustrated in FIG. 4 and/or is generally parallel to an Z axis (perpendicular to the X axis and the Y axis). Where upper and lower are defined along the Y axis.

In one aspect, the buffer layer 104 may include an upper portion of high purity GaN and the buffer layer 104 may also include a lower portion that may form an AlGaN back barrier to achieve better electron confinement. In one aspect, the lower portion that forms the back barrier may be AlGaN of n type. The back barrier construction may be implemented in any of the aspects of the disclosure.

In one aspect, the buffer layer 104 may be high purity GaN. In one aspect, the buffer layer 104 may be high purity GaN that may be a low-doped n-type. In one aspect, the buffer layer 104 may also use a higher band gap Group III-nitride layer as a back barrier, such as an AlGaN back barrier, on the other side of the buffer layer 104 from a barrier layer 108 to achieve better electron confinement.

In one aspect, the buffer layer 104 may have a buffer layer thickness defined as a distance between an upper surface of the substrate layer 102 and a lower surface of the barrier layer 108. In one aspect, the buffer layer thickness may be less than 0.8 microns, less than 0.7 microns, less than 0.6 microns, less than 0.5 microns, or less than 0.4 microns. In one aspect, the buffer layer thickness may have a range of 0.8 microns to 0.6 microns, 0.7 microns to 0.5 microns, 0.6 microns to 0.4 microns, 0.5 microns to 0.3 microns, 0.4 microns to 0.2 microns, or 0.7 microns to 0.3 microns.

In one aspect, the transistor 100 may have an intervening layer(s) thickness defined as a length between an upper surface of the substrate layer 102 and a lower surface of the barrier layer 108. In one aspect, the intervening layer(s) thickness may be less than 0.8 microns, less than 0.7 microns, less than 0.6 microns, less than 0.5 microns, or less than 0.4 microns. In one aspect, the intervening layer(s) thickness may have a range of 0.8 microns to 0.6 microns, 0.7 microns to 0.5 microns, 0.6 microns to 0.4 microns, 0.5 microns to 0.3 microns, or 0.4 microns to 0.2 microns.

The barrier layer 108 may be formed on the buffer layer 104. In one aspect, the barrier layer 108 may be formed directly on the buffer layer 104, and in other aspects, the barrier layer 108 is formed on the buffer layer 104 with intervening layer(s). Depending on the aspect, the buffer layer 104 may be formed of different suitable materials such as a Group III-nitride such as $Al_xGa_yIn_{(1-x-y)}N$ (where $0<=x<=1$, $0<=y<=1$, $x+y<=1$), e.g., AlGaN, AlN, or InAlGaN, or another suitable material. In one aspect, the barrier layer 108 may be AlGaN, and in another aspect the barrier layer 108 is AlN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In particular aspects, the barrier layer 108 may include a planer upper surface that is generally parallel to an X axis as illustrated in FIG. 4 and/or is generally parallel to an Z axis (perpendicular to the X axis and the Y axis). In particular aspects, the barrier layer 108 may include a planer lower surface that is generally parallel to an X axis as illustrated in FIG. 4 and/or is generally parallel to an Z axis (perpendicular to the X axis and the Y axis). Where upper and lower are defined along the Y axis.

In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, a bandgap of the buffer layer 104 that may be GaN may be less than a bandgap of the barrier layer 108 that may be AlGaN to form the two-dimensional electron gas (2DEG) at a heterointerface 152 between the buffer layer 104 and barrier layer 108 when biased at an appropriate level.

In aspects of the disclosure, the heterointerface 152 may be between the barrier layer 108 and the buffer layer 104. In one aspect, the source 110 and the drain 112 electrodes may be formed making ohmic contacts such that an electric current flows between the source 110 and the drain 112 electrodes via a two-dimensional electron gas (2DEG) induced at the heterointerface 152 between the buffer layer 104 and barrier layer 108 when the gate 114 electrode is biased at an appropriate level. In one aspect, the heterointerface 152 may be in the range of 0.005 μm to 0.007 μm, 0.007 μm to 0.009 μm, and 0.009 μm to 0.011 μm.

In one aspect, the source 110, the drain 112 and the gate 114 may be formed on the barrier layer 108. The source 110, the drain 112, and/or the gate 114 may be arranged directly on the barrier layer 108 or may be on intervening layer(s) on the barrier layer 108, such as an AlGaN layer on an AlN barrier layer. Other or additional intervening layers are possible. For example, a spacer layer 116 of SiN, AlO, SiO, $SiO_2$, AlN, or the like or combinations thereof can be provided on the barrier layer 108 or other intervening layers. In one aspect, the barrier layer 108 may include a region 164 under the source 110 and/or the drain 112 that is a N+ material. In one aspect, the barrier layer 108 may include a region 164 under the source 110 and/or drain 112 that is Si doped. In one aspect, the n-type dopants in the region 164 are implanted.

In one aspect, the source 110, the drain 112 and the gate 114 may be formed on the buffer layer 104. The source 110, the drain 112, and/or the gate 114 may be arranged directly on the buffer layer 104 or may be on intervening layer(s) on the buffer layer 104, such as an AlGaN layer on an AlN barrier layer. In one aspect, the buffer layer 104 may include a region 164 under the source 110 and/or the drain 112 that is a N+ material. In one aspect, the buffer layer 104 may include a region 164 under the source 110 and/or drain 112 that is Si doped. In one aspect, the n-type dopants in the region 164 are implanted.

In some aspects, the source 110 and the drain 112 may be symmetrical with respect to the gate 114. In some switch device application aspects, the source 110 and the drain 112 may be symmetrical with respect to the gate 114. In some aspects, the source 110 and the drain 112 may be asymmetrical with respect to the gate 114. In one aspect, the gate 114 may be a T-shaped gate. In one aspect, the gate 114 may be a non-T shaped gate.

To protect and separate the gate 114 and the drain 112, a spacer layer 116 may be arranged on the barrier layer 108, on a side opposite the buffer layer 104, adjacent the gate 114, the drain 112 and the source 110. The spacer layer 116 may be a passivation layer made of SiN, AlO, SiO, $SiO_2$, AlN, or the like, or a combination incorporating multiple layers thereof. In one aspect, the spacer layer 116 is a passivation layer made of SiN. In one aspect, the spacer layer 116 can be deposited using MOCVD, plasma chemical vapor deposition (CVD), hot-filament CVD, or sputtering. In one aspect, the spacer layer 116 may include deposition of $Si_3N_4$. In one aspect, the spacer layer 116 forms an insulating layer. In one aspect, the spacer layer 116 forms an insulator. In one aspect, the spacer layer 116 may be a dielectric. In one aspect, a spacer layer 116 may be provided on the barrier layer 108. In one aspect, the spacer layer 116 may include non-conducting material such as a dielectric. In one aspect, the spacer layer 116 may include a number of different layers of dielectrics or a combination of dielectric layers. In one aspect, the spacer layer 116 may be many different thicknesses, with a suitable range of thicknesses being approximately 0.5 to 2 microns. In one aspect, the spacer layer 116 may include a material such as a Group III nitride material having different Group III elements such as alloys of Al, Ga, or In, with a suitable spacer layer material being $Al_xIn_yGa_{1-x-y}$ (where $0<=x<=1$ and $0<=y<=1$, $x+y<=1$).

In some aspects, the gate 114 may be deposited in a channel formed in the spacer layer 116, and a T-gate may be formed using semiconductor processing techniques understood by those of ordinary skill in the art. Other gate configurations are possible.

In aspects of the transistor 100 of the disclosure, the substrate layer 102 may be silicon carbide and include a carbon face. In one aspect, the substrate layer 102 may be silicon carbide and include a carbon face arranged adjacent the buffer layer 104. In one aspect, the substrate layer 102 may be silicon carbide and include a carbon face and the substrate layer 102 may be flipped so as to be arranged adjacent the buffer layer 104. In this aspect, the buffer layer 104 may be GaN having a nitrogen face adjacent the carbon face of the substrate layer 102. In one aspect, the buffer layer 104 may be GaN having alternating GaN and N layers with a N layer and/or a nitrogen face adjacent the carbon face of the substrate layer 102.

In aspects of the transistor 100 of the disclosure, the buffer layer 104 may include nonpolar GaN. In one aspect, the buffer layer 104 may include semipolar GaN. In one aspect, the buffer layer 104 may include hot wall epitaxy. In one aspect, the buffer layer 104 may include hot wall epitaxy having a thickness in the range of 0.15 microns to 0.25 microns, 0.2 microns to 0.3 microns, 0.25 microns to 0.35 microns, 0.3 microns to 0.35 microns, 0.35 microns to 0.4 microns, 0.4 microns to 0.45 microns, 0.45 microns to 0.5 microns, 0.5 microns to 0.55 microns, or 0.15 microns to 0.55 microns. The p-type material layer 106 may help avoid breakdowns and problems with material impurities. For example, without a p-type material layer 106, the transistor 100 may need impurities, which do not discharge well. The p-type material layer 106 may be formed beneath the gate 114, and may extend toward the source 110 and the drain 112 of the device.

In aspects of the transistor 100 of the disclosure, the buffer layer 104 may be designed to be of the high purity type where the Fermi level is in the upper half of the bandgap, which reduces slow trapping effects normally observed in GaN HEMTs. In this regard, the traps under the Fermi level are filled always and thus slow transients may be prevented. In some aspects, the buffer layer 104 may be as thin as possible consistent with achieving good crystalline quality. Applicants have already demonstrated 0.4 μm layers with good quality.

In aspects of the transistor 100 of the disclosure, a $Al_xIn_yGa_{1-x-y}$ (where $0<=x<=1$ and $0<=y<=1$, $x+y<=1$) nucleation layer 136 or buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer 136 may depend on the material of the substrate layer 102.

In aspects of the transistor 100 of the disclosure, the buffer layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

Figure 10:
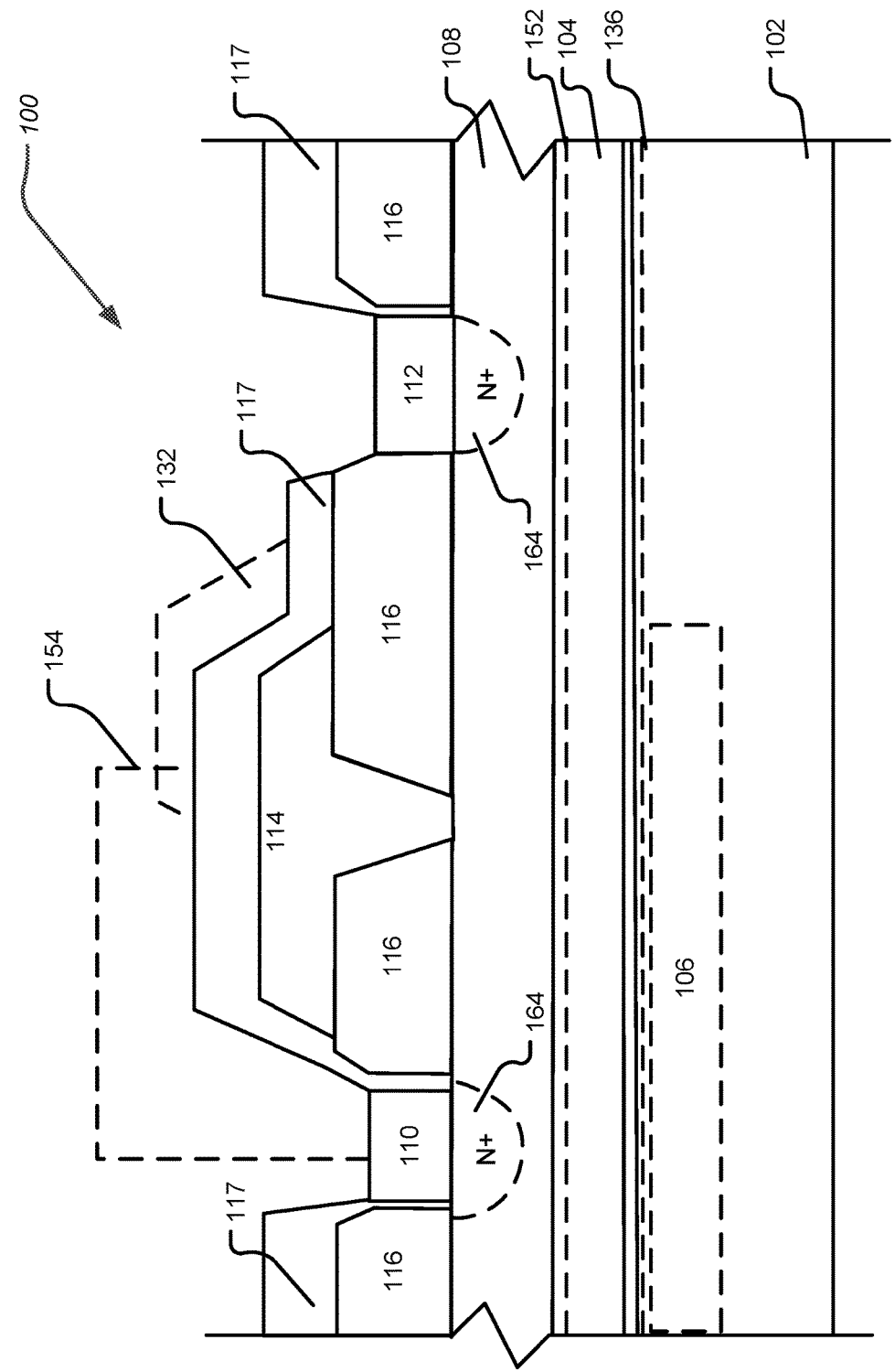
FIG. 10 shows a cross-sectional view of another aspect of a transistor according to the disclosure.

With reference to the description of FIG. 10, the transistor 100 may include a second spacer layer 117 that may be formed on the spacer layer 116 and the gate 114. With reference to the description of FIG. 11, the transistor 100 may include a field plate 132. With reference to the description of FIG. 12, the transistor 100 may include a connection 154 to the field plate 132.

Figure 5:
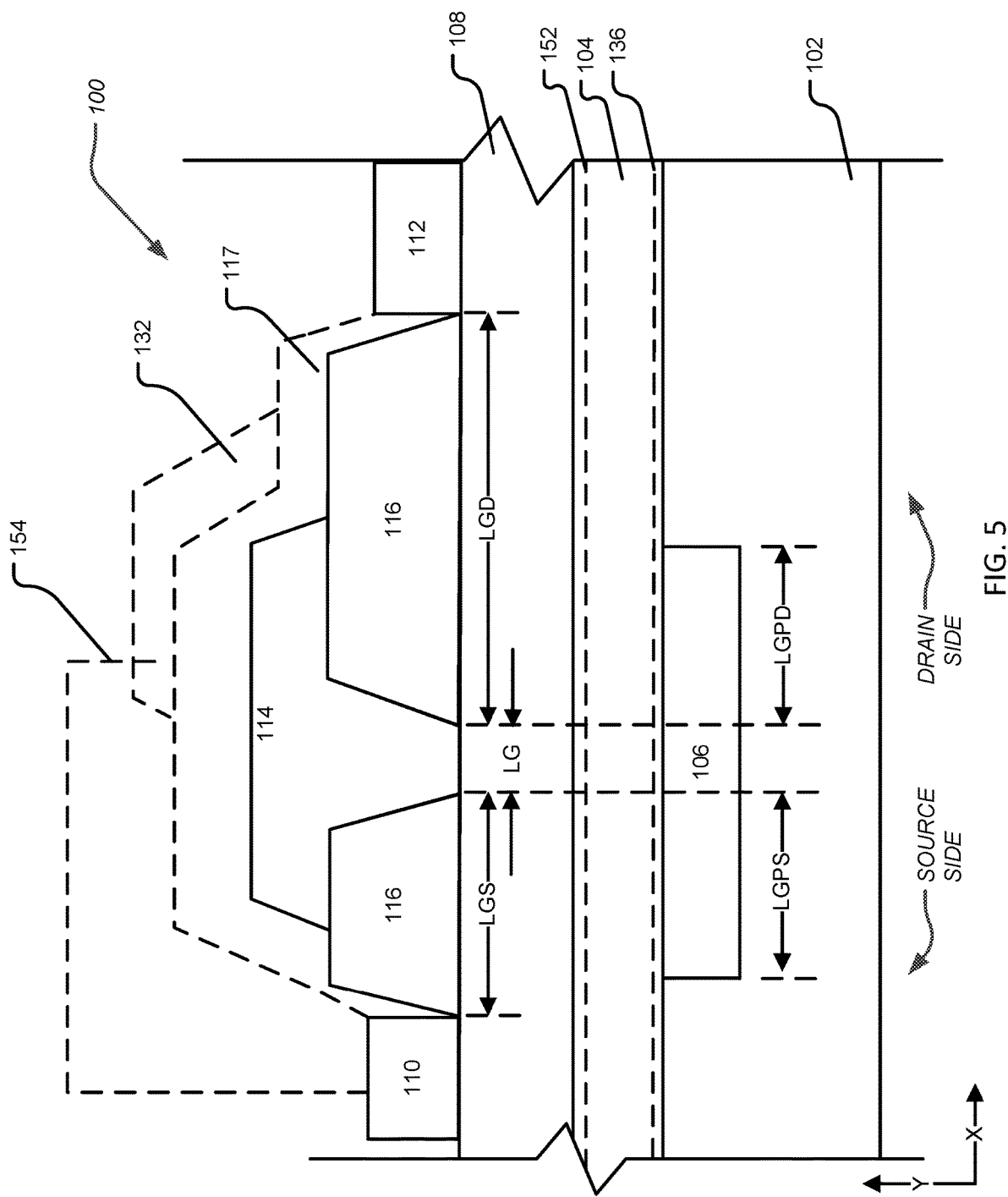
FIG. 5 shows a cross-sectional view of an aspect of the transistor according to FIG. 4.

FIG. 5 shows a cross-sectional view of an aspect of the transistor according to FIG. 4.

In particular, FIG. 5 shows a cross-sectional view of a transistor 100. More specifically, the transistor 100 described in detail herein may be utilized in conjunction with the transistor package 200, the overload detection circuit 302, the recovery enhancement circuit 300 and/or the like as described above. Moreover, the transistor 100 illustrated in FIG. 5 may include any one or more features described herein.

In one aspect of the disclosure, the p-type material layer 106 may not extend over the entire area of the transistor 100. In this regard, the p-type material layer 106 may be selectively arranged as described herein, the p-type material layer 106 may be arranged over the entire length and selectively removed as described herein, the p-type material layer 106 may be arranged over the entire length and selectively electrically neutralized as described herein, or the like. Accordingly, the specific constructions of the p-type material layer 106 described below encompass any of these processes that result in the p-type material layer 106 having an operating construction and arrangement as noted below. In other words, the length and/or size of the p-type material layer 106 does not include a part that is partially electrically neutralized, partially etched, or the like. The length and/or size of the p-type material layer 106 may depend on the application of the transistor 100, requirements for the transistor 100, and the like. Limiting a length of the p-type material layer 106 reduces gate lag effect, avoids adverse effects on RF performance for certain transistor applications, and/or the like.

As shown in FIG. 5, the p-type material layer 106 may be present in limited areas as described in further detail below. In some aspects, the p-type material layer 106 may be present in a gate—source region. In some aspects, the p-type material layer 106 may be present in a gate—source region and also partly under the gate 114. In some aspects, the p-type material layer 106 may be arranged at least partially under the gate 114 and/or the source 110. In some aspects, the p-type material layer 106 may be arranged at least partially under the gate 114 and/or and not arranged under the source 110.

In one aspect, the p-type material layer 106 may be arranged at least partially vertically under the gate 114 along the y-axis and may extend along the x-axis partially toward the source 110 and the drain 112. In this aspect, no portion of the p-type material layer 106 may be located vertically along the y-axis below the source 110; and no portion of the p-type material layer 106 may be located vertically along the y-axis below the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100. In this regard, a source side of the transistor 100 is defined as a side of the transistor 100 extending from the gate 114 toward and past the source 110 as illustrated in FIG. 5; and a drain side of the transistor 100 is defined as a side of the transistor 100 extending from the gate 114 toward and past the drain 112 as illustrated in FIG. 5.

In one aspect, the p-type material layer 106 may be arranged at least partially vertically under the gate 114 along the y-axis and may extend along the x-axis partially toward the source 110 and the drain 112. In this aspect, only a portion of the p-type material layer 106 may be located vertically along the y-axis below the source 110; and no portion of the p-type material layer 106 may be located vertically along the y-axis below the source 110. In this aspect, a portion of the substrate layer 102 may not include the p-type material layer 106 located vertically along the y-axis below the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100.

In one aspect, the p-type material layer 106 may be arranged at least partially vertically under the gate 114 along the y-axis and may extend along the x-axis partially toward the source 110 and the drain 112. In this aspect, a portion of the p-type material layer 106 may be located vertically along the y-axis entirely below the source 110; and no portion of the p-type material layer 106 may be located vertically along the y-axis below the drain 112. In this aspect, a portion of the substrate layer 102 may not include the p-type material layer 106 located vertically along the y-axis past the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100.

In one aspect, the p-type material layer 106 may be arranged vertically under the gate 114 along the y-axis and may extend along the x-axis partially toward the source 110 and the drain 112. In this aspect, a portion of the p-type material layer 106 may be located vertically along the y-axis entirely below the source 110; and no portion of the p-type material layer 106 may be located vertically along the y-axis below the source 110. In this aspect, a portion of the substrate layer 102 may not include the p-type material layer 106 located vertically along the y-axis past the source 110. In this aspect, a portion of the substrate layer 102 may be free of the p-type material layer 106 on a source side of the transistor 100; and a portion of the substrate layer 102 may be free of the p-type material layer 106 on a drain side of the transistor 100.

With reference to FIG. 5, various dimensions of components of the transistor 100 will be described in order to define dimensions of the p-type material layer 106. The gate 114 may have a width LG along a lower surface of the gate 114 that is adjacent the barrier layer 108 that is parallel to the X axis. In particular, the width LG may extend from one lower corner of the gate 114 to the other lower corner of the gate 114. The definition of the width LG is illustrated in FIG. 5. In some aspects, the width LG may be between 0.5 µm and 0.6 µm, 0.5 µm and 0.6 µm, 0.4 µm and 0.5 µm, 0.3 µm and 0.4 µm, 0.2 µm and 0.3 µm, 0.1 µm and 0.2 µm, or 0.1 µm and 0.5 µm in length along the x-axis. In some aspects, a width of the gate 114 above a lower surface may be greater than the width LG as illustrated in FIG. 5.

The distance from the gate 114 to the source 110 may be defined as distance LGS. In particular, the distance LGS may be defined as a distance from a lower corner of the gate 114 on a source side to a lower corner of the source 110 on a gate side. The definition of the distance LGS is illustrated in FIG. 5.

The distance from the gate 114 to the drain 112 may be defined as the distance LGD. In particular, the distance LGD may be defined as a distance from a lower corner of the gate 114 on a drain side to a lower corner of the drain 112 on a gate side. The definition of the distance LGD is illustrated in FIG. 5.

In one aspect, the p-type material layer 106 may extend laterally along the x-axis from at least beneath the lower corner of the gate 114 on a source side toward the source 110 a distance LGPS. The definition of the distance LGPS is illustrated in FIG. 5. In some aspects, the distance LGPS may be between 1 µm and 6 µm, 5 µm and 6 µm, 4 µm and 5 µm, 3 µm and 4 µm, 2 µm and 3 µm, or 1 µm and 3 µm in length along the x-axis.

In one aspect, the p-type material layer 106 may extend laterally along the x-axis from at least beneath the lower corner of the gate 114 on a drain side toward the drain 112 a distance LGPD. In some aspects, the distance LGPD may be between 0.1 µm and 0.6 µm, 0.5 µm and 0.6 µm, 0.4 µm and 0.5 µm, 0.3 µm and 0.4 µm, 0.2 µm and 0.3 µm, or 0.1 µm and 0.3 µm in length along the x-axis.

Accordingly, a length of the p-type material layer 106 may be a sum of the distance LGPD, the width LG, and the distance LGPS. In this regard, a length of the p-type material layer 106 reduces gate lag effect, avoids adverse effects on RF performance for certain transistor applications, and/or the like.

In one aspect, the length LGPS may be 100% to 700% of LG, 100% to 200% of LG, 200% to 300% of LG, 300% to 400% of LG, 400% to 500% of LG, 500% to 600% of LG, or 600% to 700% of LG.

In one aspect, the length LG may be 10% to 180% of LGPD, 10% to 20% of LGPD, 20% to 30% of LGPD, 30% to 40% of LGPD, 40% to 50% of LGPD, 50% to 60% of LGPD, 60% to 70% of LGPD, 70% to 80% of LGPD, 80% to 90% of LGPD, 90% to 100% of LGPD, 100% to 110% of LGPD, 110% to 120% of LGPD, 110% to 130% of LGPD, 130% to 140% of LGPD, 140% to 150% of LGPD, 150% to 160% of LGPD, 160% to 170% of LGPD, or 170% to 180% of LGPD.

In one aspect, the length LGS may be 10% to 180% of LGPS, 10% to 20% of LGPS, 20% to 30% of LGPS, 30% to 40% of LGPS, 40% to 50% of LGPS, 50% to 60% of LGPS, 60% to 70% of LGPS, 70% to 80% of LGPS, 80% to 90% of LGPS, 90% to 100% of LGPS, 100% to 110% of LGPS, 110% to 120% of LGPS, 110% to 130% of LGPS, 130% to 140% of LGPS, 140% to 150% of LGPS, 150% to 160% of LGPS, 160% to 170% of LGPS, or 170% to 180% of LGPS.

In one aspect, the length LG may be 10% to 180% of LGPD, 10% to 20% of LGPD, 20% to 30% of LGPD, 30% to 40% of LGPD, 40% to 50% of LGPD, 50% to 60% of LGPD, 60% to 70% of LGPD, 70% to 80% of LGPD, 80% to 90% of LGPD, 90% to 100% of LGPD, 100% to 110% of LGPD, 110% to 120% of LGPD, 110% to 130% of LGPD, 130% to 140% of LGPD, 140% to 150% of LGPD, 150% to 160% of LGPD, 160% to 170% of LGPD, or 170% to 180% of LGPD.

In one or more aspects, a part of a source side of the substrate layer 102 may be free of the p-type material layer 106. In one or more aspects, a part of a drain side of the substrate layer 102 may be free of the p-type material layer 106. In one or more aspects, a part of a source side of the substrate layer 102 may be free of the p-type material layer 106 and a part of a drain side of the substrate layer 102 may be free of the p-type material layer 106. In one or more aspects, the p-type material layer 106 may be arranged under and across a length of the gate 114 and may extend toward the source 110 and the drain 112.

In one or more aspects, a distance LGD may be a distance from a lower corner of the gate 114 on the drain 112 side to a lower corner of the drain 112 on a gate side; a distance LGS may be a distance from a lower corner of the gate 114 on the source 110 side to a lower corner of the source 110 on a gate side; and the distance LGD may be greater than the distance LGS. In one or more aspects, a distance LGPS may define a length of a portion of the p-type material layer 106 from a lower corner of the gate 114 on the source 110 side toward the source 110; a distance LGPD may define a length of a portion of the p-type material layer 106 from a lower corner of the gate 114 on the drain 112 side toward the drain 112; and the distance LGPS may be equal to the distance LGPD. In one or more aspects, a distance LGPS may define a length of a portion of the p-type material layer 106 from a lower corner of the gate 114 on the source 110 side toward the source 110; a distance LGPD may define a length of a portion of the p-type material layer 106 from a lower corner of the gate 114 on the drain 112 side toward the drain 112; and the distance LGPS may be greater than the distance LGPD. In one or more aspects, a distance LGPS may define a length of a portion of the p-type material layer 106 from a lower corner of the gate 114 on the source 110 side toward the source 110; a distance LGPD may define a length of a portion of the p-type material layer 106 from a lower corner of the gate 114 on the drain 112 side toward the drain 112; and the distance LGPD may be greater than the distance LGPS.

In one or more aspects, the p-type material layer 106 may extend toward the source 110 but does not vertically overlap the source 110. In one or more aspects, the p-type material layer 106 may vertically overlap the source 110. In one or more aspects, the p-type material layer 106 may extend toward the drain 112 but does not vertically overlap the drain 112. In one or more aspects, the p-type material layer 106 may vertically overlap the drain 112. In one or more aspects, the p-type material layer 106 may be electrically connected to the gate 114. In one or more aspects, the gate 114 may be electrically connected to any external circuit or voltage. In one or more aspects, the p-type material layer 106 may have no direct electrical connections. In one or more aspects, the p-type material layer 106 may be electrically connected to the source 110.

In some aspects, part of the voltage from a drain 112 to a source 110 may be dropped in the p-type material layer 106 region. This may also deplete the channel in the lateral direction. The lateral depletion may reduce the lateral field and increase breakdown voltage. Alternatively, a more compact structure can be obtained for a required breakdown voltage. The p-type material layer 106 may eliminate the need to have C or Fe doping of the buffer needed to sustain the applied drain voltage. Elimination of C and Fe leads to decreased current reduction under operating conditions (no trapping). Moreover, in some aspects the p-type material layer 106 may support the field.

In some aspects, the p-type material layer 106 may also be configured to have a varying doping and/or implantation profile perpendicular to the surface. In some aspects, the p-type material layer 106 may also be configured to have a varying profile perpendicular to the surface extending into the cross-sectional views of the Figures. The profile may be configured to achieve desired breakdown voltage, device size, switching time, and the like.

Figure 6:
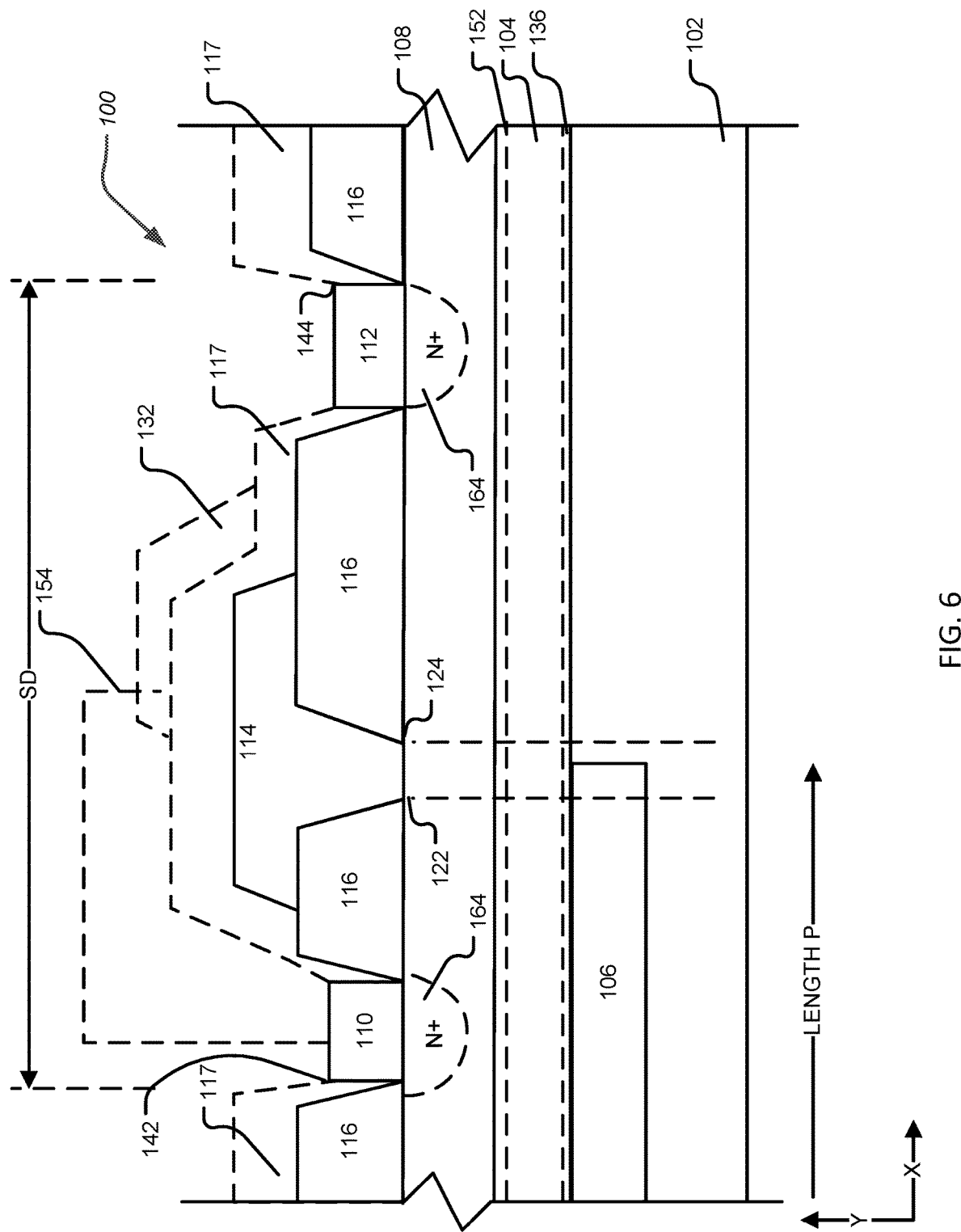
FIG. 6 shows a cross-sectional view of an aspect of the transistor according to FIG. 4.

FIG. 6 shows a cross-sectional view of an aspect of the transistor according to FIG. 4.

In particular, FIG. 6 shows a cross-sectional view of a transistor 100. More specifically, the transistor 100 described in detail herein may be utilized in conjunction with the transistor package 200, the overload detection circuit 302, the recovery enhancement circuit 300 and/or the like as described above. Moreover, the transistor 100 illustrated in FIG. 6 may include any one or more features described herein.

In one aspect, the p-type material layer 106 may not extend over the entire area of the substrate layer 102 as shown by the arrow LENGTH P as shown in FIG. 6. In this regard, the p-type material layer 106 may be selectively arranged as described in detail below, the p-type material layer 106 may be arranged over the entire length and selectively removed as described in detail below, the p-type material layer 106 may be arranged over the entire length and selectively electrically neutralized as described in detail below, or the like. Accordingly, the specific constructions of the p-type material layer 106 described below encompass any of these configurations that result in the p-type material layer 106 having an operating construction and arrangement as noted below. In other words, the length and/or size of the p-type material layer 106 does not include a part that is partially electrically neutralized or partially etched. The length and/or size of the p-type material layer 106 may depend on the application of the transistor 100, requirements for the transistor 100, and the like.

With reference to the aspects further described below, the p-type material layer 106 may extend horizontally along the X axis parallel to the arrow LENGTH P. Moreover, the p-type material layer 106 may extend horizontally parallel to the arrow LENGTH P to a point defined by a line that is perpendicular (parallel to the y-axis) to the arrow LENGTH P and extends through a component of the transistor 100 as illustrated.

In one aspect, of the disclosure, the p-type material layer 106 may extend laterally from at least beneath the source 110 to a position beneath a first edge 124 of the gate 114. In particular, the first edge 124 may be an edge of the gate 114 on a side of the gate 114 adjacent the drain 112 and which may also be a lowest surface of the gate 114.

In certain aspects of the disclosure, the p-type material layer 106 may extend to a point within about 0 to about 0.7 μm of a first edge 124 of the gate 114. In certain aspects of the disclosure, the p-type material layer 106 may extend to a point within about 0 to about 0.5 μm of the first edge 124 of the gate 114. In certain aspects of the disclosure, the p-type material layer 106 may extend to a point within about 0 to about 0.3 μm of the first edge 124 of the gate 114.

In one aspect, of the disclosure, the p-type material layer 106 may extend laterally from at least beneath the source 110 to a position beneath a second edge 122 of the gate 114. In particular, the second edge 122 may be an edge of the gate 114 on a side of the gate 114 adjacent the source 110 and which may also be a lowest surface of the gate 114.

In certain aspects of the disclosure, the p-type material layer 106 may extend to a point within about 0 to about 0.7 μm of the second edge 122 of the gate 114. In certain aspects of the disclosure, the p-type material layer 106 may extend to a point within about 0 to about 0.5 μm of the second edge 122 of the gate 114. In certain aspects of the disclosure, the p-type material layer 106 may extend to a point within about 0 to about 0.3 μm of the second edge 122 of the gate 114.

In other aspects, a length of the p-type material layer 106 LENGTH P can also be seen in relation to positions and/or lengths of other components based on the length SD as illustrated in FIG. 6. The length SD in this case may be the length between an edge 142 of the source 110 toward an edge 144 of the drain 112 as shown in FIG. 6. In particular, the edge 142 may be defined as an edge or surface on the source 110 that is parallel to the Y axis on a side of the source 110 opposite to the gate 114; and, the edge 144 may be defined as an edge or surface on the drain 112 that is parallel to the Y axis on a side of the drain 112 opposite to the gate 114.

In one aspect, the length of the p-type material layer 106 may extend from 10% to 20% of the length of SD, meaning the p-type material layer 106 may extend 10% to 20% past the edge 142 of the source 110 toward the drain 112. In one aspect, the length of the p-type material layer 106 may extend from 20% to 30% of the length of SD, meaning the p-type material layer 106 may extend 20% to 30% past the edge 142 of the source 110 toward the drain 112. In one aspect, the length of the p-type material layer 106 may extend from 30% to 40% of the length of SD, meaning the p-type material layer 106 may extend 30% to 40% past the edge 142 of the source 110 toward the drain 112. In one aspect, the length of the p-type material layer 106 may extend from 40% to 50% of the length of SD, meaning the p-type material layer 106 may extend 40% to 50% past the edge 142 of the source 110 toward the drain 112. In one aspect, the length of the p-type material layer 106 may extend from 50% to 60% of the length of SD, meaning the p-type material layer 106 may extend 50% to 60% past the edge 142 of the source 110 toward the drain 112. In one aspect, the length of the p-type material layer 106 may extend from 60% to 70% of the length of SD, meaning the p-type material layer 106 may extend 60% to 70% past the edge 142 of the source 110 toward the drain 112. In one aspect, the length of the p-type material layer 106 may extend from 70% to 80% of the length of SD, meaning the p-type material layer 106 may extend 70% to 80% past the edge 142 of the source 110 toward the drain 112.

Figure 7:
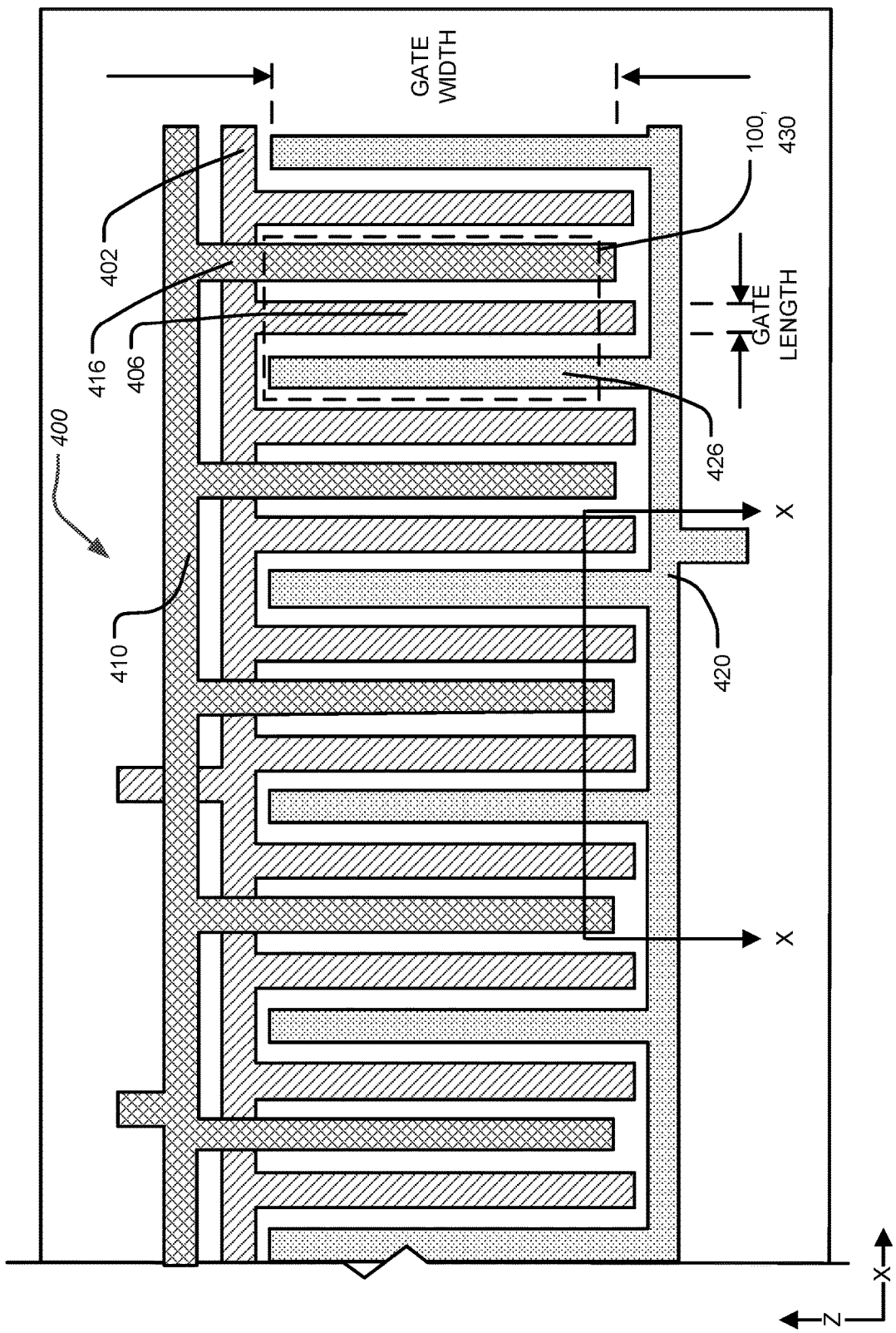
FIG. 7 illustrates a semiconductor device that may include a plurality of unit cell transistors in accordance with an aspect of the disclosure.

FIG. 7 illustrates a semiconductor device that may include a plurality of unit cell transistors in accordance with an aspect of the disclosure.

As shown in FIG. 7, aspects of the disclosure may include a semiconductor device 400 that may include a plurality of the transistor 100. In particular, the transistor 100 may be one of a plurality of unit cells 430 implemented in the semiconductor device 400. Additionally, the semiconductor device 400 described in detail herein may be utilized in conjunction with the transistor package 200, the overload detection circuit 302, the recovery enhancement circuit 300 and/or the like as described above.

In particular, FIG. 7 illustrates a transistor 100 that may include any one or more aspects of the disclosure described herein. In particular, the transistor 100 of FIG. 7 may include the p-type material layer 106 as described above. In this regard, the transistor 100 of FIG. 7 implements a length of the p-type material layer 106 as described herein that reduces gate lag effect, avoids adverse effects on RF performance for certain transistor applications, and/or the like.

The semiconductor device 400 may include a gate bus 402 that may be connected to a plurality of gate fingers 406 that may extend in parallel in a first direction (e.g., the Z-direction indicated in FIG. 7) that connect to or form part of the gate 114. A source bus 410 may be connected to a plurality of parallel ones of source contacts 416 that connect to or form part of the source 110. In some aspects, the source bus 410 may be connected to a ground voltage node on an underside of the semiconductor device 400. A drain bus 420 may be connected to a plurality of drain contacts 426 that connect to or form part of the drain 112.

As can be seen in FIG. 7, each gate finger 406 may run along the Z-direction between a pair of adjacent ones of the source contact 416 and the drain contact 426. The semiconductor device 400 may include a plurality of unit cells 430, where each one of the plurality of unit cells 430 includes an implementation of the transistor 100. One of the plurality of unit cells 430 is illustrated by the dashed Box in FIG. 7, and includes a gate finger 406 that extends between adjacent ones of the source contact 416 and the drain contact 426.

The "gate width" refers to the distance by which the gate finger 406 overlaps with its associated one of the source contact 416 and drain contact 426 in the Z-direction. That is, "width" of a gate finger 406 refers to the dimension of the gate finger 406 that extends in parallel to and adjacent an implementation of the source contact 416 and the drain contact 426 (the distance along the Z-direction). Each of the plurality of unit cells 430 may share one of the source contact 416 and/or the drain contact 426 with one or more adjacent ones of the plurality of unit cells 430. Although a particular number of the of the plurality of unit cells 430 is illustrated in FIG. 7, it will be appreciated that the semiconductor device 400 may include more or less of the plurality of unit cells 430.

Figure 8:
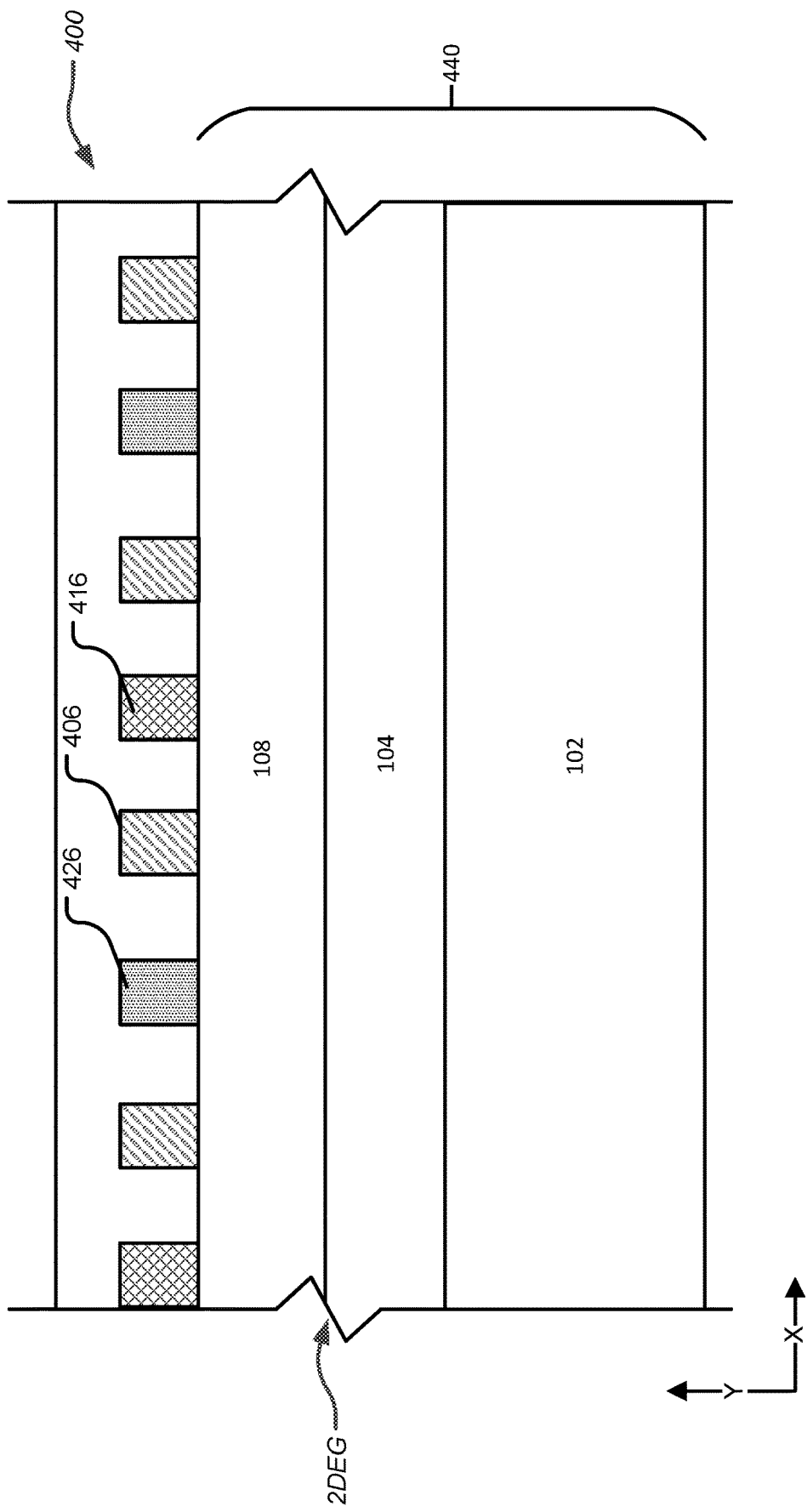
FIG. 8 is a schematic cross-sectional view taken along line X-X of FIG. 7.

FIG. 8 is a schematic cross-sectional view taken along line X-X of FIG. 7.

Referring to FIG. 8, the semiconductor device 400 may include a semiconductor structure 440 that includes the substrate layer 102, the buffer layer 104, the barrier layer 108, and/or the like as described herein. The source contact 416 and the drain contact 426 may be on the barrier layer 108 as described herein. The gate fingers 406 may be on the substrate layer 102 between the source contacts 416 and the drain contacts 426 as described herein. While the gate fingers 406, the source contact 416, and the drain contacts 426 are all shown schematically in FIG. 7 and FIG. 8 as having a similar "dimension," it will be appreciated that each may have different shapes and dimensions consistent with the disclosure.

Figure 9:
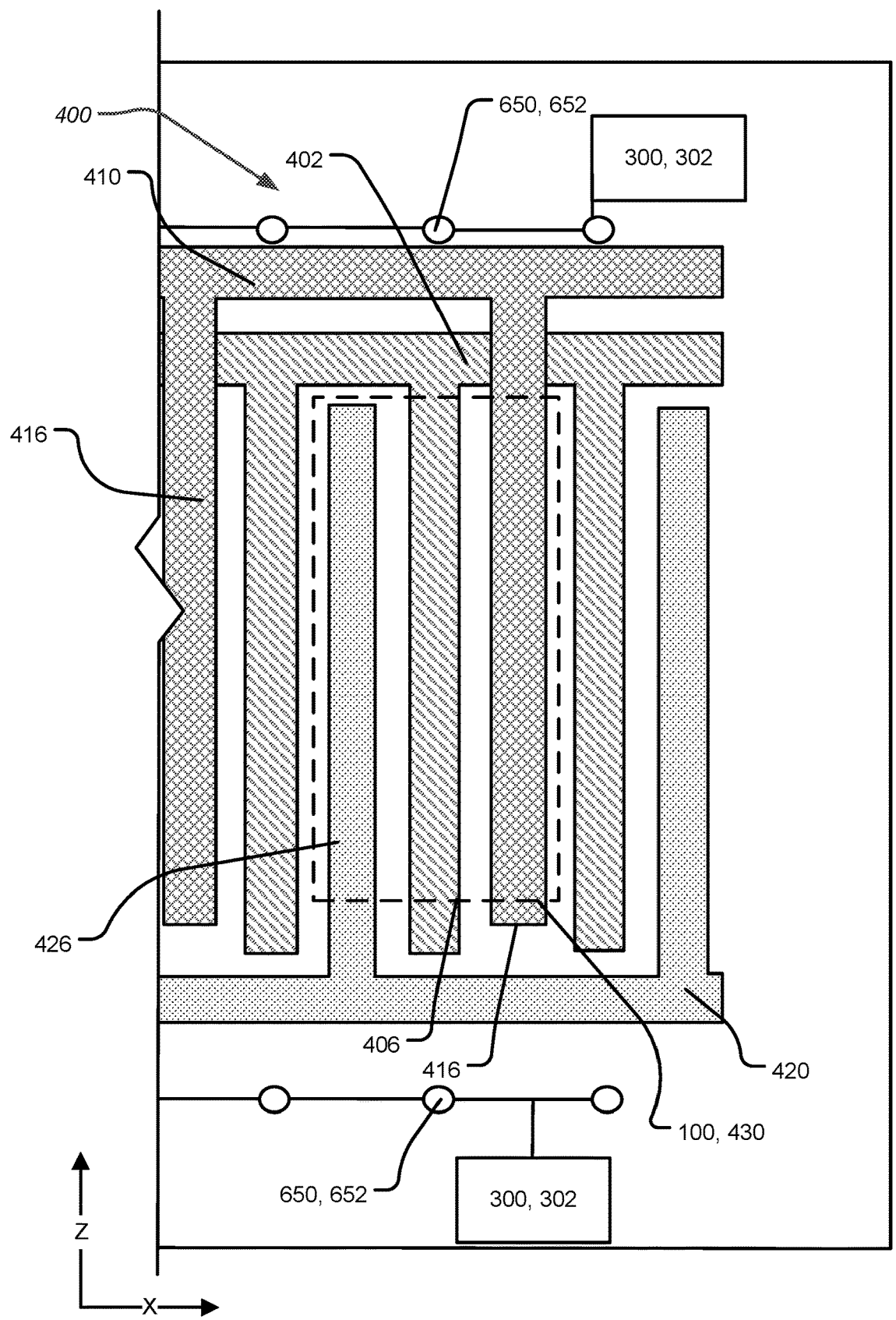
FIG. 9 illustrates a top view of one aspect of a transistor according to the disclosure.

FIG. 9 illustrates a top view of one aspect of a transistor according to the disclosure.

In particular, the transistor 100 may include a connection 650. The connection 650 may be connected to the p-type material layer 106, the recovery enhancement circuit 300, and/or the overload detection circuit 302. Additionally, the connection 650 may be connected to the p-type material layer 106. Accordingly, the connection 650 may permit the recovery enhancement circuit 300 to provide a bias voltage, a dynamic electrical pulse, and/or the like to the p-type material layer 106 of the transistor 100 to enhance recovery time of the transistor 100. In this regard, once a high voltage level, a high current level, a high voltage level signal, a high current level signal, and/or the like being applied to the transistor 100 and in particular the gate 114 has subsided, the overload detection circuit 302 may initiate operation of the recovery enhancement circuit 300 to provide a bias voltage, a dynamic electrical pulse, and/or the like to the connection 650 and the p-type material layer 106 of the transistor 100 to enhance recovery time, reduce an impact of the overload, reduce recovery time, reduce a gate lag, reduce an impact of gate lag, reduce an increase of gate lag, reduce gate lag trapping effects, and/or the like of the transistor 100.

The connection 650 may be achieved by etching down to the p-type material layer 106 near the ends of the gate fingers 406 and making a metal contact to the p-type material layer 106. In one aspect, the connection 650 may be implemented at least in part as a via. The via may extend through one or more layers of the transistor 100. The via may extend through one or more of the second spacer layer 117, the spacer layer 116, the barrier layer 108, the buffer layer 104, and/or the like. In certain aspects, the connection 650 may include a contact 652 electrically connected to a bias voltage, a dynamic electrical pulse, and/or the like from the recovery enhancement circuit 300 in response to the overload detection circuit 302.

In one aspect, the connection 650 may be arranged at one end of the gate fingers 406, at both ends of the gate fingers 406, at one end of a plurality of the gate fingers 406, at both ends of a plurality of the gate fingers 406, at one end of every one of the gate fingers 406, at both ends of every one of the gate fingers 406, and/or the like. In one aspect, the connection 650 may be arranged at one end of the gate 114, at both ends of the gate 114, at one end of a plurality of the gate 114, at both ends of a plurality of the gate 114, at one end of every one of the gate 114, at both ends of every one of the gate 114, and/or the like.

In one aspect, the connection 650 may have a p-type material contact on the p-type material layer 106. The p-type material contact may be formed on the p-type material layer 106 in a recess provided in the buffer layer 104, the barrier layer 108, and/or the like. The p-type material contact may be electrically coupled to the p-type material layer 106. The recess may extend down to the p-type material layer 106 to allow for the p-type material contact to be created there. The recess may be formed by etching the buffer layer 104, the barrier layer 108, and/or the like, and may also use a material to define the recess. The material may be removed after the recess has been created.

The connection 650 may include a connection to the p-type material layer 106 and/or the contact 652. In particular, the connection 650 or portions thereof may extend from the p-type material contact in the recess formed in the transistor 100 and may extend up to the contact 652.

The connection 650, the contact 652, and/or the p-type material contact may be electrically coupled to the p-type material layer 106. The recess may be configured as a partial recess, partial trench, or the like in a surface of the transistor 100. In one aspect, a region or area under or adjacent the p-type material contact may be implanted and/or doped with p-dopants to form an electrical connection with the p-type material layer 106. In one aspect, the layer may be an epitaxial material on which is provided the p-type material contact.

In one aspect, the contact 652 may be configured as a contact, a pad, a contact pad, a transistor control pad, a HEMT control pad, and/or the like. In this aspect, the p-type material layer 106 through the connection 650 and/or the contact 652 may receive a bias voltage, a dynamic electrical pulse, and/or the like from the recovery enhancement circuit 300. In this regard, the p-type material layer 106 may be used to modulate characteristics of the transistor 100.

In one aspect, the connection 650 and/or the contact 652 may include a conductive material, many different conductive materials, a suitable material being a metal, or combinations of metals, deposited using standard metallization methods. In one aspect, the materials may include one or more of titanium, gold, nickel, or the like.

In one aspect, the connection 650 may be a metallic connection that extends from the p-type material contact to the contact 652. In one aspect, the contact 652 may be a buried contact pad. In this regard, the contact 652 may be buried in any one of the above-noted structures of the transistor 100. In one aspect, the contact 652 may be arranged on the barrier layer 108. In one aspect, the contact 652 may be arranged directly on the barrier layer 108. In one aspect, the contact 652 may be arranged on a spacer layer 116 on the barrier layer 108. In one aspect, the contact 652 may be separate and separated from the gate 114, the source 110, and/or the drain 112.

FIG. 10 shows a cross-sectional view of another aspect of a transistor according to the disclosure.

In particular, FIG. 10 shows a cross-sectional view of a transistor 100. More specifically, the transistor 100 described in detail herein may be utilized in conjunction with the transistor package 200, the overload detection circuit 302, the recovery enhancement circuit 300 and/or the like as described above.

In particular, FIG. 10 illustrates a transistor 100 that may include any one or more aspects of the disclosure described herein. In particular, the transistor 100 of FIG. 10 may include the p-type material layer 106 as described above. In this regard, the transistor 100 of FIG. 10 implements a length of the p-type material layer 106 as described herein that reduces gate lag effect, avoids adverse effects on RF performance for certain transistor applications, and/or the like.

In particular, FIG. 10 illustrates a transistor 100 that may include any one or more aspects of the disclosure described herein. In particular, the transistor 100 of FIG. 10 may include the p-type material layer 106 as described above. In this regard, the transistor 100 of FIG. 10 implements a length of the p-type material layer 106 as described herein that reduces gate lag effect, avoids adverse effects on RF performance for certain transistor applications, and/or the like.

FIG. 10 further illustrates implementation of the second spacer layer 117. The second spacer layer 117 may be provided over the gate 114 and/or the spacer layer 116. The second spacer layer 117 may be a passivation layer made of SiN, AlO, SiO, SiO₂, AlN, or the like, or a combination incorporating multiple layers thereof.

In one aspect, the second spacer layer 117 is a passivation layer made of SiN. In one aspect, the second spacer layer 117 can be deposited using MOCVD, plasma chemical vapor deposition (CVD), hot-filament CVD, or sputtering. In one aspect, the second spacer layer 117 may include deposition of $Si_3N_4$. In one aspect, the second spacer layer 117 forms an insulating layer. In one aspect, the second spacer layer 117 forms an insulator. In one aspect, the second spacer layer 117 may be a dielectric. In one aspect, a second spacer layer 117 may be provided on the spacer layer 116. In one aspect, the second spacer layer 117 may include non-conducting material such as a dielectric. In one aspect, the second spacer layer 117 may include a number of different layers of dielectrics or a combination of dielectric layers. In one aspect, the second spacer layer 117 may be many different thicknesses, with a suitable range of thicknesses being approximately 0.5 to 2 microns. In one aspect, the second spacer layer 117 may include a material such as a Group III nitride material having different Group III elements such as alloys of Al, Ga, or In, with a suitable spacer layer material being $Al_xIn_yGa_{1-x-y}$ (where $0<=x<=1$ and $0<=y<=1$, $x+y<=1$).

Figure 11:
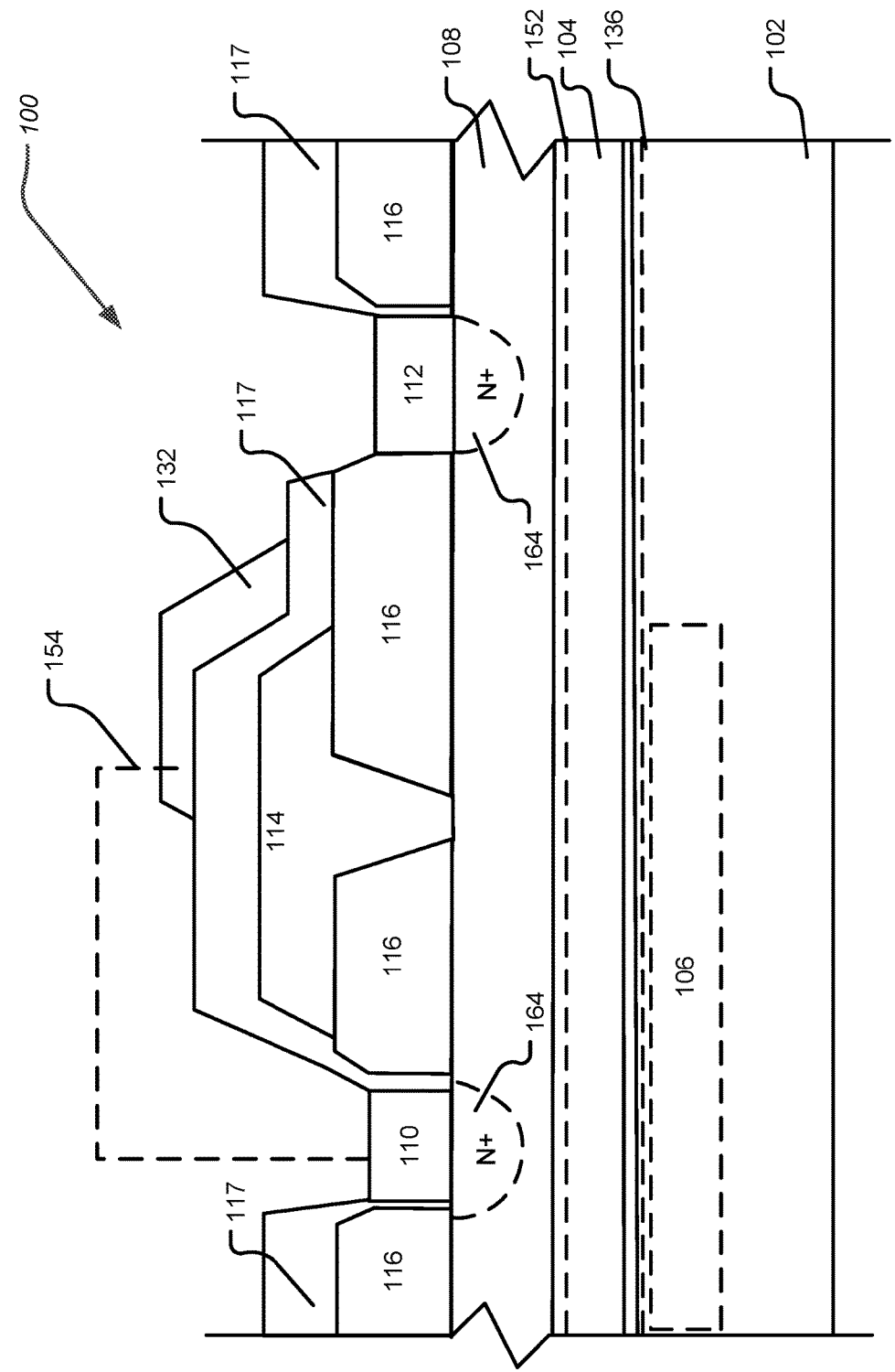
FIG. 11 shows a cross-sectional view of another aspect of a transistor according to the disclosure.

FIG. 11 shows a cross-sectional view of another aspect of a transistor according to the disclosure.

In particular, FIG. 11 shows a cross-sectional view of a transistor 100. More specifically, the transistor 100 described in detail herein may be utilized in conjunction with the transistor package 200, the overload detection circuit 302, the recovery enhancement circuit 300 and/or the like as described above.

In particular, FIG. 11 illustrates a transistor 100 that may include any one or more aspects of the disclosure described herein. The transistor 100 of FIG. 11 may include the p-type material layer 106 as described above. In particular, FIG. 11 illustrates a transistor 100 that may include any one or more aspects of the disclosure described herein. In particular, the transistor 100 of FIG. 11 may include the p-type material layer 106 as described above. In this regard, the transistor 100 of FIG. 11 implements a length of the p-type material layer 106 as described herein that reduces gate lag effect, avoids adverse effects on RF performance for certain transistor applications, and/or the like.

FIG. 11 further illustrates implementation of the field plate 132. In one aspect, the field plate 132 may be arranged on the second spacer layer 117 between the gate 114 and drain 112. In one aspect, the field plate 132 may be deposited on the second spacer layer 117 between the gate 114 and the drain 112. In one aspect, the field plate 132 may be electrically connected to one or more other components in the transistor 100. In one aspect, the field plate 132 may not be electrically connected to any other components of the transistor 100. In some aspects, the field plate 132 may be adjacent the gate 114 and a second spacer layer 117 of dielectric material may be included at least partially over the gate 114 to isolate the gate 114 from the field plate 132. In some aspects, the field plate 132 may overlap the gate 114 and a second spacer layer 117 of dielectric material may be included at least partially over the gate 114 to isolate the gate 114 from the field plate 132.

The field plate 132 may extend different distances from the edge of the gate 114, with a suitable range of distances being approximately 0.1 to 2 microns. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the field plate 132 may be formed on the second spacer layer 117 between the gate 114 and the drain 112, with the field plate 132 being in proximity to the gate 114 but not overlapping the gate 114. In one aspect, a space between the gate 114 and field plate 132 may be wide enough to isolate the gate 114 from the field plate 132, while being small enough to maximize a field effect provided by the field plate 132.

In certain aspects, the field plate 132 may reduce a peak operating electric field in the transistor 100. In certain aspects, the field plate 132 may reduce the peak operating electric field in the transistor 100 and may increase the breakdown voltage of the transistor 100. In certain aspects, the field plate 132 may reduce the peak operating electric field in the transistor 100 and may reduce trapping in the transistor 100. In certain aspects, the field plate 132 may reduce the peak operating electric field in the transistor 100 and may reduce leakage currents in the transistor 100.

In other aspects, for example, the spacer layer 116 is formed on the barrier layer 108 and on the gate 114. In such aspects, the field plate 132 can be formed directly on the spacer layer 116. Other multiple field plate configurations are possible with the field plate 132 overlapping or non-overlapping with the gate 114 and/or multiple field plates 132 being used.

Figure 12:
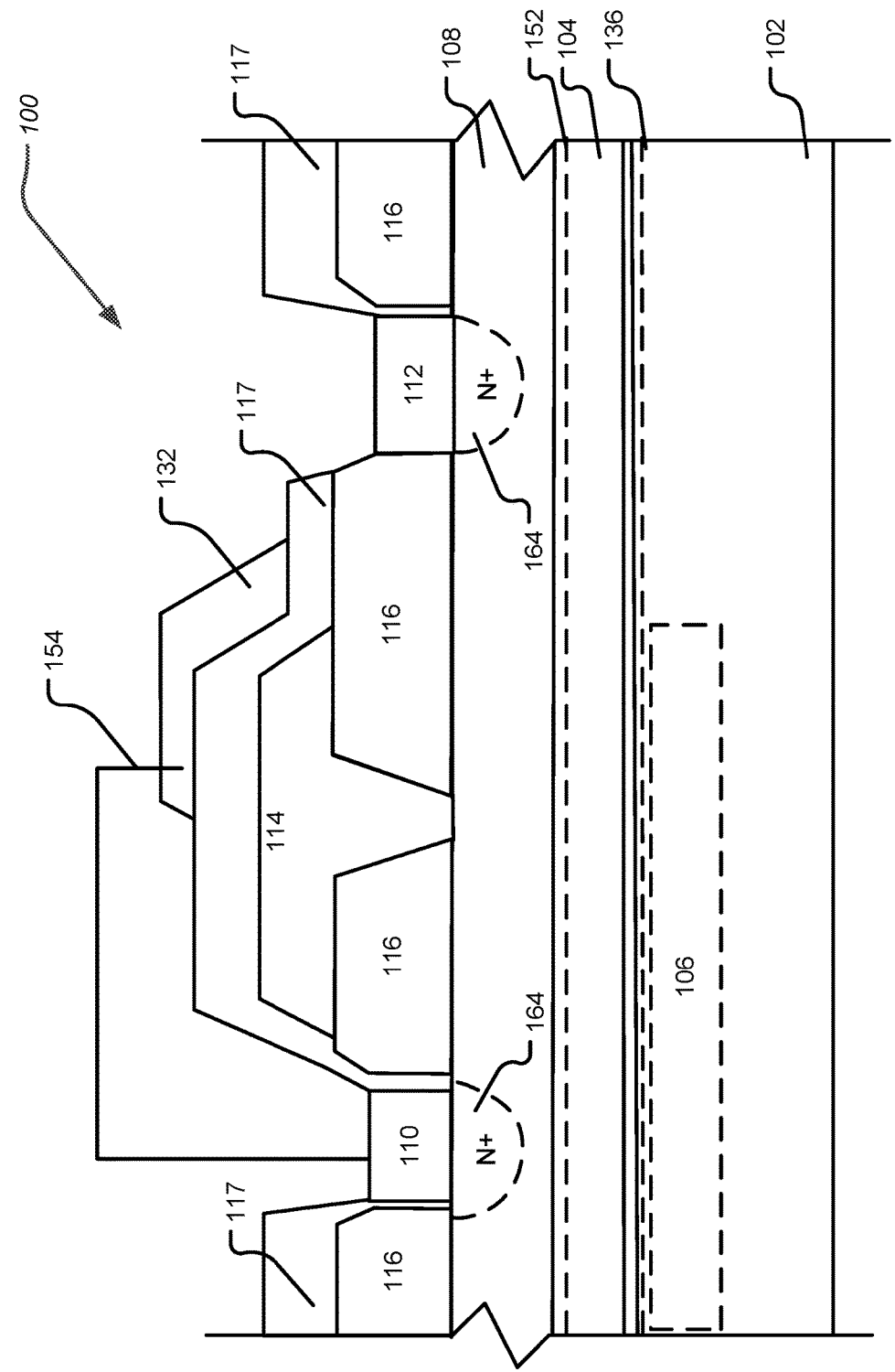
FIG. 12 shows a cross-sectional view of another aspect of a transistor according to the disclosure.

FIG. 12 shows a cross-sectional view of another aspect of a transistor according to the disclosure.

In particular, FIG. 12 shows a cross-sectional view of a transistor 100. More specifically, the transistor 100 described in detail herein may be utilized in conjunction with the transistor package 200, the overload detection circuit 302, the recovery enhancement circuit 300 and/or the like as described above.

In particular, FIG. 12 illustrates a transistor 100 that may include any one or more aspects of the disclosure described herein. In particular, the transistor 100 of FIG. 12 may include the p-type material layer 106 as described above. FIG. 12 further illustrates implementation of the field plate 132 that may be electrically connected to the source 110 through a connection 154. In particular, FIG. 12 illustrates a transistor 100 that may include any one or more aspects of the disclosure described herein. In particular, the transistor 100 of FIG. 12 may include the p-type material layer 106 as described above. In this regard, the transistor 100 of FIG. 12 implements a length of the p-type material layer 106 as described herein that reduces gate lag effect, avoids adverse effects on RF performance for certain transistor applications, and/or the like.

In one aspect, the connection 154 may be formed on the spacer layer 116 and/or the second spacer layer 117 to extend between the source 110 and the field plate 132. In some aspects, the connection 154 may include a conductive material, many different conductive materials, a suitable material being a metal, or combinations of metals, deposited using standard metallization methods. In one aspect, the materials may include one or more of titanium, gold, nickel, or the like.

In particular, the transistor 100 of FIG. 12 illustrates the field plate 132 connected to the source 110 through the connection 154 (source—field plate interconnect). Additionally or alternatively, the field plate 132 may be connected to the gate 114 through a connection (gate—field plate interconnect (not shown)). In one aspect, the connection 154 may be formed on the spacer layer 116 and/or the second spacer layer 117 to extend between the field plate 132 and the source 110. In one aspect, the connection 154 may be formed with the field plate 132 during the same manufacturing step. In one aspect, a plurality of the connection 154 and/or a plurality of gate—field plate interconnect may be used. In one aspect, a plurality of the field plates 132 may be used. In one aspect, a plurality of the field plates 132 may be used and each of the plurality of field plates 132 may be stacked with a dielectric material therebetween. In some aspects, the connection 154 and/or a plurality of gate—field plate interconnect may include a conductive material, many different conductive materials, a suitable material being a metal, or combinations of metals, deposited using standard metallization methods. In one aspect, the materials may include one or more of titanium, gold, nickel, or the like.

In one aspect, the gate—field plate interconnect may be formed on the spacer layer 116 and/or the second spacer layer 117 to extend between the gate 114 and the field plate 132. In some aspects, the gate—field plate interconnect may include a conductive material, many different conductive materials, a suitable material being a metal, or combinations of metals, deposited using standard metallization methods. In one aspect, the materials may include one or more of titanium, gold, nickel, or the like.

In one aspect of the transistor 100 described herein, the gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three-layer structure. Such a structure may have advantages because of the high adhesion of some materials. In one aspect, the gate 114 may further include an overlayer of highly conductive metal. In one aspect, the gate 114 may be configured as a T-shaped gate.

In one aspect of the transistor 100 described herein, one or more metal overlayers may be provided on one or more of the source 110, the drain 112, and the gate 114. The overlayers may be Au, Silver (Ag), Al, Pt, Ti, Si, Ni, Al, and/or Copper (Cu).

In one aspect of the transistor 100 described herein, a second buffer layer may be deposited or grown on a first implementation of the buffer layer 104 on a side of the first implementation of the buffer layer 104 opposite of the substrate layer 102. In one aspect, the second buffer layer may be formed directly on the first implementation of the buffer layer 104. In one aspect, the second buffer layer may be a high-purity material such as Gallium Nitride (GaN), AlN, or the like. In one aspect, the second buffer layer may be a high-purity GaN. In one aspect, the second buffer layer may be a high-purity AlN. The second buffer layer may be a p-type material or n-type material. In another aspect, the second buffer layer may be undoped.

In certain embodiments, the source 110 may be electrically connected to a p-type material contact through a connection. In certain embodiments, the field plate 132 may be electrically connected to the source 110 through the connection. In certain embodiments, the field plate 132 may be connected to the source 110, and the source 110 may be connected to the p-type material contact through the connection.

In certain embodiments, the gate 114 may be electrically connected to the p-type material contact through a connection (not shown). In certain embodiments, the field plate 132 may be electrically connected to the gate 114 through the connection. In certain embodiments, the field plate 132 may be connected to the gate 114, and the gate 114 may be connected to the p-type material contact through the connection.

Figure 13:
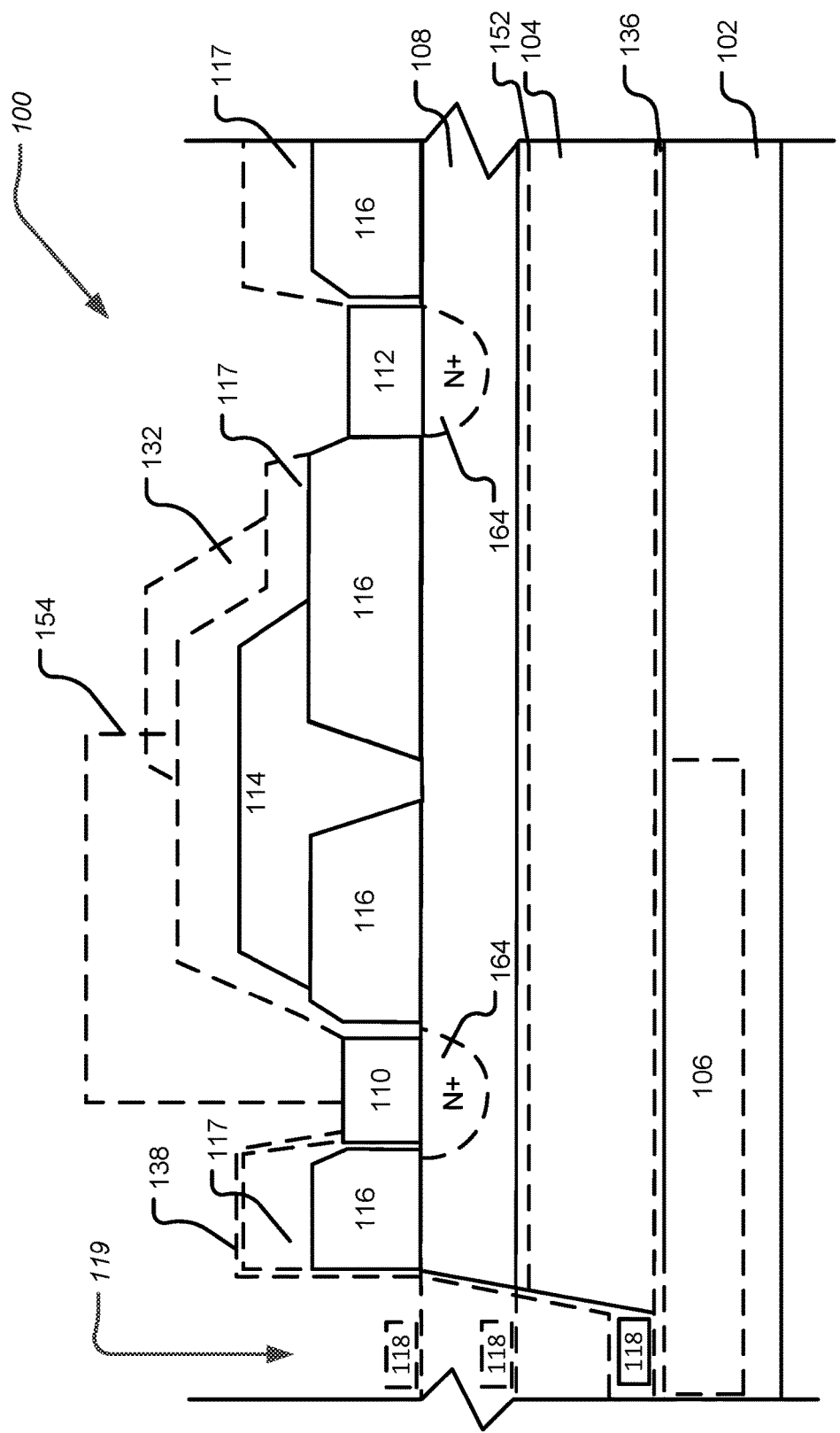
FIG. 13 shows a cross-sectional view of another aspect of a transistor according to the disclosure.

FIG. 13 shows a cross-sectional view of another aspect of a transistor according to the disclosure.

In particular, FIG. 13 shows a cross-sectional view of a transistor 100. More specifically, the transistor 100 described in detail herein may be utilized in conjunction with the transistor package 200, the overload detection circuit 302, the recovery enhancement circuit 300 and/or the like as described above.

In particular, FIG. 13 illustrates a transistor 100 that may include any one or more aspects of the disclosure described herein. In particular, the transistor 100 of FIG. 13 may include the p-type material layer 106 as described above.

In various aspects of the disclosure, the p-type material layer 106 of the transistor 100 may be buried within the substrate layer 102 and otherwise may not be electrically connected to any portion of the transistor 100. In one aspect as illustrated in FIG. 13, the transistor 100 may include a p-type material contact 118 that may be electrically connected to receive an external signal, bias, and/or the like. The p-type material contact 118 may be electrically connected and arranged in the substrate layer 102, the p-type material layer 106, the substrate layer 102, the buffer layer 104, the barrier layer 108, and/or the like. The p-type material contact 118 may be formed in a recess 119 in the substrate layer 102, the p-type material layer 106, the substrate layer 102, the buffer layer 104, the barrier layer 108, and/or the like. The recess 119 may extend down to the p-type material layer 106 to allow for the p-type material contact 118 to be created there. The recess 119 may be formed by etching, and may also use a material to define the recess 119. The material may be removed after the recess 119 has been created.

In particular, the recess 119 may remove any material above the p-type material layer 106 within a portion of a region associated with the source 110, exposing the p-type material layer 106 on a side opposite of the substrate layer 102. In another aspect of the disclosure, to create a place for the p-type material contact 118, a recess 119 may be created by removing at least part of the substrate layer 102, the p-type material layer 106, the substrate layer 102, the buffer layer 104, the barrier layer 108, and/or the like.

In certain embodiments, the source 110 may be electrically connected to the p-type material contact 118 through a connection 138. In certain embodiments, the field plate 132 may be electrically connected to the source 110 through the connection 154. In certain embodiments, the field plate 132 may be connected to the source 110, and the source 110 may be connected to the p-type material contact 118 through the connection 138.

In certain embodiments, the gate 114 may be electrically connected to the p-type material contact 118 through a connection (not shown). In certain embodiments, the field plate 132 may be electrically connected to the gate 114 through the connection. In certain embodiments, the field plate 132 may be connected to the gate 114, and the gate 114 may be connected to the p-type material contact 118 through the connection.

FIG. 13 is meant to broadly describe different embodiments of the present invention (e.g., different p-layer and/or field plate configurations), but in the interest of clarity, not all embodiments are expressly depicted. It should be understood that the transistor 100 structures of the present invention can be utilized with a variety of p-type material layer 106 structures as described herein and otherwise. In certain embodiments, the p-type material layer 106 structure may be electrically connected to a separate bias voltage/control signal, electrically connected to the source 110 or electrically connected to the gate 114 or not electrically connected to the source 110, the gate 114, and the separate bias/control signal. Such electrical connection can be through a via in the epitaxial material and/or an electrical connection outside and/or at an edge of the epitaxial material. For example, the via may be structured within the recess 119. The p-type material layer 106 can be formed or structured in any of the different variations described herein or otherwise. Depending on the embodiment, various field plate 132 configurations are possible. For example, field plates 132 may be integral with the gate 114, single or multiple field plates 132 are possible with or without intervening dielectric spacer layers between the field plates 132. A field plate 132 can vertically overlap or not vertically overlap with the gate 114 or an underlying field plate 132. The field plates 132 may be electrically connected to the gate 114 or the source 110 or one or more field plates 132 connected to the gate 114, one or more filed plates 132 connected to the source 110, and/or one or more field plates 132 connected to neither the source 110 nor the gate 114.

Figure 14:
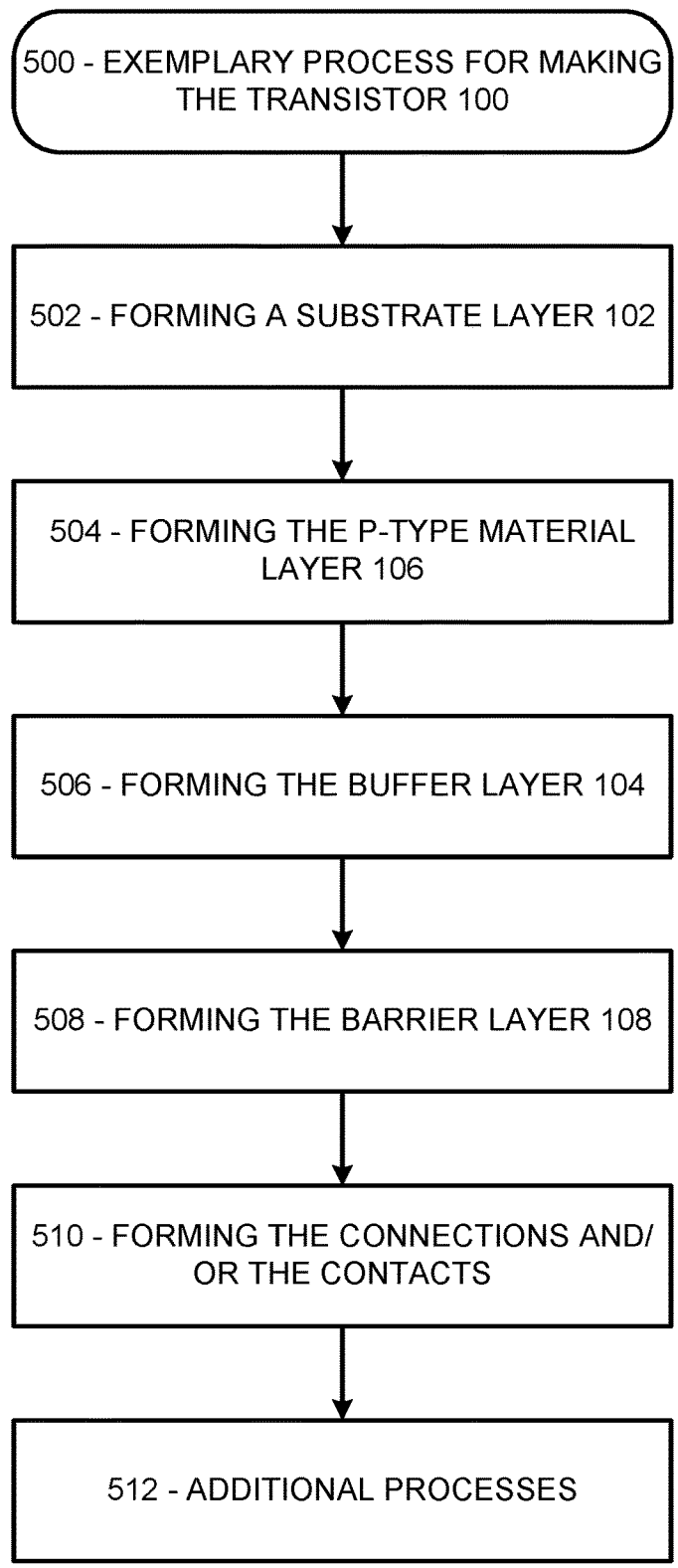
FIG. 14 shows a process for making a transistor according to the disclosure.

FIG. 14 shows a process for making a transistor according to the disclosure.

In particular, FIG. 14 shows an exemplary process 500 for making the transistor 100 and/or the transistor package 200 of the disclosure. It should be noted that the process 500 is merely exemplary and may be modified consistent with the various aspects disclosed herein. In particular, the process 500 may include any one or more aspects of the disclosure described herein. In particular, the process 500 may include making the p-type material layer 106 as described above. In this regard, the process 500 implements a length of the p-type material layer 106 as described herein that reduces gate lag effect, avoids adverse effects on RF performance for certain transistor applications, and/or the like.

The process 500 may begin at step 502 by forming a substrate layer 102. The substrate layer 102 may be formed consistent with the disclosure. For example, the substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

The process 500 may include a step 504 of forming the p-type material layer 106. The p-type material layer 106 may be formed as described in the disclosure. This may include implanting Al into the substrate layer 102 to form the p-type material layer 106 in the substrate layer 102. For example, the p-type material layer 106 may be formed by ion implantation of Al and annealing. In one aspect, the p-type material layer 106 may be formed by implantation and annealing of Al prior to the growth of any GaN layers. In one aspect, the ion implantation may utilize channeling implants. In one aspect, the channeling implants may include aligning the ion beam to the substrate layer 102. Alignment of the ion beam may result in increased implantation efficiency. In some aspects, the process 500 may further include implanting Al into the substrate layer 102 to form the p-type material layer 106 in the substrate layer 102. Thereafter, the substrate layer 102 may be annealed as defined herein. In one aspect, the p-type material layer 106 may be formed by ion implantation of $^{27}Al$ in 4H-SiC implanted with channeling conditions with an implant energy of $E_1=100$ keV with a dose of 1E13 $cm^2$ at 25° C. In one aspect, the p-type material layer 106 may be formed by ion implantation of $^{27}Al$ in 4H-SiC implanted with channeling conditions with an implant energy of $E_2=300$ keV with a dose of 1E13 $cm^2$ at 25° C. However, other implant energies and doses are contemplated as well.

The process 500 may include a step 506 of forming the buffer layer 104 on the substrate layer 102. The buffer layer 104 may be grown or deposited on the substrate layer 102 as described in the disclosure. In one aspect, the buffer layer 104 may be GaN. In another aspect, the buffer layer 104 may be formed with LEO. In one aspect, a nucleation layer 136 may be formed on the substrate layer 102 and the buffer layer 104 may be formed at step 506 on the nucleation layer 136. The buffer layer 104 may be grown or deposited on the nucleation layer 136. In one aspect, the buffer layer 104 may be GaN. In another aspect, the buffer layer 104 may be formed with LEO.

Further during the process 500 as part of step 508, the barrier layer 108 may be formed on the buffer layer 104. The barrier layer 108 may be formed as described in the disclosure. For example, the barrier layer 108 may be an n-type conductivity layer or may be undoped. In one aspect, the barrier layer 108 may be AlGaN.

Further during the process 500 as part of step 510, to create a place for contact with the p-type material layer 106, a recess may be created by removing at least part of the barrier layer 108 and at least part of the buffer layer 104. The recess formation process may remove any material above the p-type material layer 106 within a portion of a region associated with the source 110, exposing the p-type material layer 106 on a side opposite of the substrate layer 102.

Further during the process 500 as part of step 510, to create a place for contact with the p-type material layer 106, a recess may be created by removing at least part of the barrier layer 108 and at least part of the buffer layer 104. The process 500 as part of step 510 may include forming the connection 650 that may include removing any material above the p-type material layer 106, exposing the p-type material layer 106 on a side opposite of the substrate layer 102. In another aspect of the disclosure, to create a place for contact with the p-type material layer 106, the connection 650 may be created by removing at least part of the barrier layer 108 and at least part of the buffer layer 104. The recess formation process may remove any material above the p-type material layer 106 within a portion of a region associated with the source 110, exposing the p-type material layer 106 on a side opposite of the substrate layer 102.

Further in step 510, the contact 652 may be formed. Once the p-type material layer 106 is exposed, nickel or another suitable material may be evaporated to deposit the contact 652. The nickel or another suitable material may be annealed to form an ohmic contact, for example. In some aspects, the contacts of the contact 652 may include Al, Ti, Si, Ni, and/or Pt. Such a deposition and annealing process may be carried out utilizing conventional techniques known to those of skill in the art. For example, an ohmic contact for the contact 652 may be annealed at a temperature of from about 600° C. to about 1050° C. Once the contact 652 has been formed on the p-type material layer 106, a metal overlayer may electrically couple the contact 652 of the p-type material layer 106 to the source 110. Doing this may maintain the conductivity of the p-type material layer 106 and the source 110 at the same potential.

Further during the process 500 as part of step 512, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable. In some aspects, the source 110 may include Al, Ti, Si, Ni, and/or Pt. In one aspect, a region 164 under the source 110 that is a N+ material may be formed in the barrier layer 108. In one aspect, a region 164 under the drain 112 may be Si doped.

Further during the process 500 as part of step 512, the drain 112 may be arranged on the barrier layer 108. Like the source 110, the drain 112 may be an ohmic contact of Ni or another suitable material, and may also be annealed in a similar fashion. In one aspect, an n+ implant may be used in conjunction with the barrier layer 108 and the contacts are made to the implant. In one aspect, a region 164 under the drain 112 that is a N+ material may be formed in the barrier layer 108. In one aspect, a region 164 under the drain 112 may be Si doped.

Further during the process 500 as part of step 512, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials. In some aspects, the contacts of the gate 114 may include Al, Ti, Si, Ni, and/or Pt.

Further during the process 500 as part of step 512, the spacer layer 116 may be formed. The spacer layer 116 may be a passivation layer, such as SiN, AlO, SiO, SiO$_2$, AlN, or the like, or a combination incorporating multiple layers thereof, which may be deposited over the exposed surface of the barrier layer 108.

The source 110 and the drain 112 electrodes may be formed making ohmic contacts such that an electric current flows between the source 110 and drain 112 electrodes via a two-dimensional electron gas (2DEG) induced at the heterointerface 152 between the buffer layer 104 and barrier layer 108 when a gate 114 electrode is biased at an appropriate level. In one aspect, the source 110 may be electrically coupled to the barrier layer 108, the drain 112 may be electrically coupled to the barrier layer 108, and the gate 114 may be electrically coupled to the barrier layer 108 such that an electric current flows between the source 110 and the drain 112 via a two-dimensional electron gas (2DEG) induced at the heterointerface 152 between the buffer layer 104 and the barrier layer 108 when the gate 114 electrode is biased at an appropriate level. In one aspect, the source 110 may be electrically coupled to the transistor 100, the drain 112 may be electrically coupled to the transistor 100, and the gate 114 may be electrically coupled to the transistor 100 such that an electric current flows between the source 110 and the drain 112 via a two-dimensional electron gas (2DEG) induced at the heterointerface 152 between the buffer layer 104 and the barrier layer 108 when a gate 114 is biased at an appropriate level. In various aspects, the gate 114 may control a flow of electrons in the 2DEG based on a signal and/or bias placed on the gate 114. In this regard, depending on a composition of the layers and/or a doping of the layers, the transistor 100 can be normally on or the transistor 100 can be normally off with no bias or signal on the gate. In one aspect, the heterointerface 152 may be in the range of 0.005 μm to 0.007 μm, 0.007 μm to 0.009 μm, and 0.009 μm to 0.011 μm.

The gate 114 may extend on top of a spacer or the spacer layer 116. The spacer layer 116 may be etched and the gate 114 deposited such that the bottom of the gate 114 is on the surface of barrier layer 108. The metal forming the gate 114 may be patterned to extend across spacer layer 116 so that the top of the gate 114 forms a field plate 132.

Further during some aspects of the process 500 as part of step 512, a second spacer layer 117 may be formed and a field plate 132 may be arranged on top of the second spacer layer 117 and may be separated from the gate 114. In one aspect, the field plate 132 may be deposited on the second spacer layer 117 between the gate 114 and the drain 112. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the connection 154 may be formed with the field plate 132 during the same manufacturing step (see FIG. 11). In one aspect, a plurality of the field plates 132 may be used. In one aspect, a plurality of the field plates 132 may be used and each of the plurality of field plates 132 may be stacked with a dielectric material therebetween. In one aspect, the field plate 132 extends toward the edge of gate 114 towards the drain 112. In one aspect, the field plate 132 extends towards the source 110. In one aspect, the field plate 132 extends towards the drain 112 and towards the source 110. In another aspect, the field plate 132 does not extend toward the edge of gate 114. Finally, the structure may be covered with a dielectric spacer layer such as silicon nitride. The dielectric spacer layer may also be implemented similar to the spacer layer 116. Moreover, it should be noted that the cross-sectional shape of the gate 114, shown in the Figures is exemplary. For example, the cross-sectional shape of the gate 114 in some aspects may not include the T-shaped extensions. Other constructions of the gate 114 may be utilized.

Further during some aspects of the process 500 as part of step 512, the connection 154 may be formed. In some aspects, the field plate 132 may be electrically connected to the source 110 with the connection 154. In one aspect, the connection 154 may be formed on the second spacer layer 117 to extend between the field plate 132 and the source 110.

Further in step 512, the recovery enhancement circuit 300 may be created and connected to the contact 652. In particular the recovery enhancement circuit 300 may include any other features as set forth by the disclosure. Further in step 512, the overload detection circuit 302 may be created and connected to the recovery enhancement circuit 300. In particular the overload detection circuit 302 may include any other features as set forth by the disclosure.

It should be noted that the steps of process 500 may be performed in a different order consistent with the aspects described above. Moreover, the process 500 may be modified to have more or fewer process steps consistent with the various aspects disclosed herein. In one aspect of the process 500, the transistor 100 may be implemented with only the p-type material layer 106. In one aspect of the process 500, the transistor 100 may be implemented with the p-type material layer 106 and the p-type material layer 106. In one aspect of the process 500, the transistor 100 may be implemented with only the p-type material layer 106.

Figure 15:
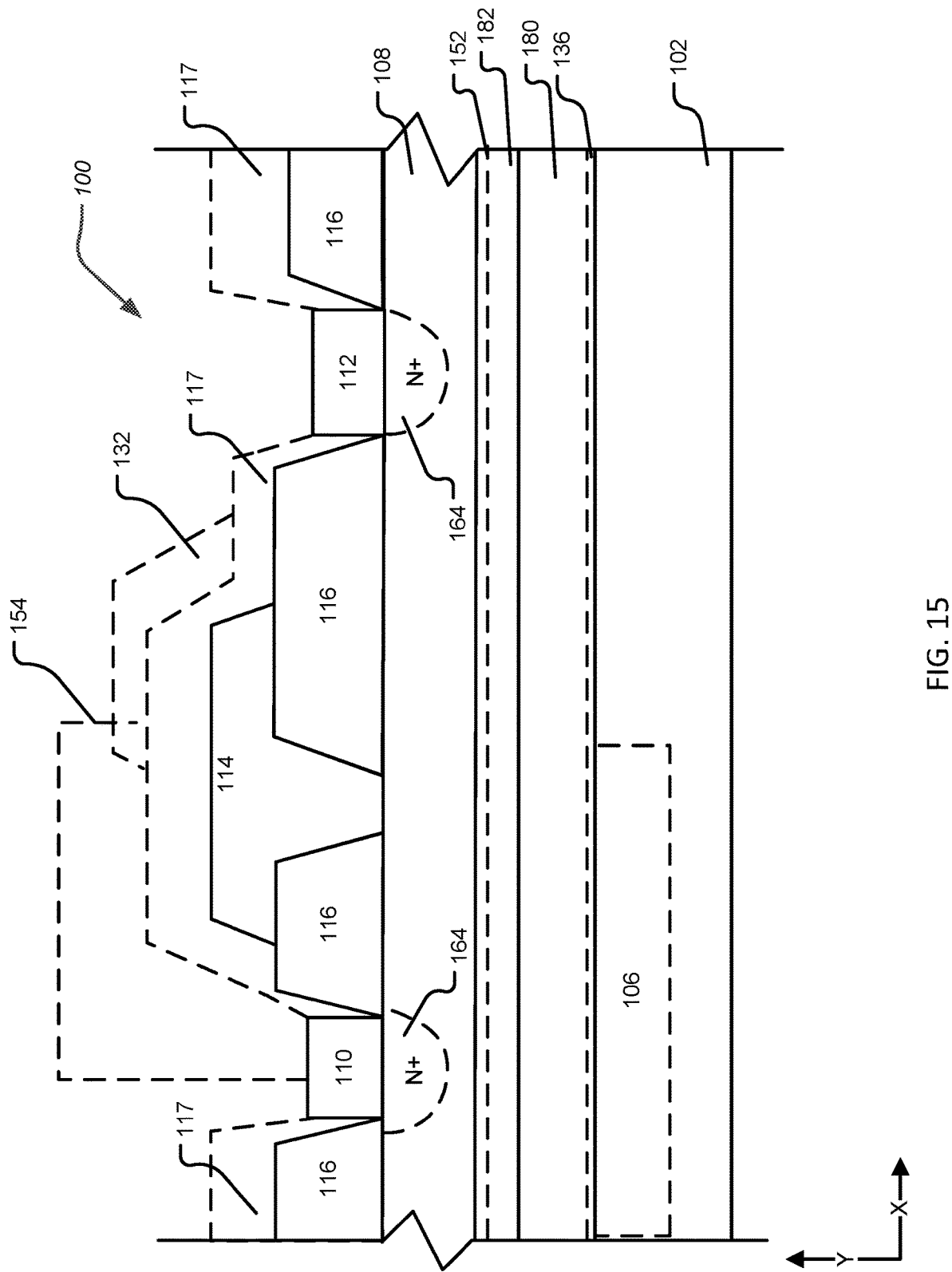
FIG. 15 shows a cross-sectional view of another aspect of a transistor according to the disclosure.

FIG. 15 shows a cross-sectional view of another aspect of a transistor according to the disclosure.

In particular, FIG. 15 shows a cross-sectional view of a transistor 100. More specifically, the transistor 100 described in detail herein may be utilized in conjunction with the transistor package 200, the overload detection circuit 302, the recovery enhancement circuit 300 and/or the like as described above.

In particular, FIG. 15 illustrates a transistor 100 that may include any one or more aspects of the disclosure described herein. The transistor 100 of FIG. 15 may include the p-type material layer 106 as described above. In particular, FIG. 15 illustrates a transistor 100 that may include any one or more aspects of the disclosure described herein. In particular, the transistor 100 of FIG. 15 may include the p-type material layer 106 as described above. In this regard, the transistor 100 of FIG. 15 implements a length of the p-type material layer 106 as described herein that reduces gate lag effect, avoids adverse effects on RF performance for certain transistor applications, and/or the like.

Further, FIG. 15 illustrates the transistor 100 implementing a back barrier layer 180 may be formed directly on the nucleation layer 136 or on the nucleation layer 136 with intervening layer(s). In aspects of the transistor 100 of the disclosure, a back barrier layer 180 may be formed directly on the substrate layer 102 or on the substrate layer 102 with intervening layer(s). In particular, the back barrier layer 180 may be configured at least in part as a gate lag reduction structure, a gate lag elimination structure, and/or the like. In particular, the back barrier layer 180 configured at least in part as a gate lag reduction structure, a gate lag elimination structure, and/or the like in conjunction with the p-type material layer 106 configured at least in part as a drain lag reduction structure, a drain lag elimination structure, and/or the like may operate together in a synergistic manner to reduce overall lag of the transistor 100. As further described herein, this synergistic overall reduction of lag of the transistor 100 was an unexpected result of the combined structures of the back barrier layer 180 and the p-type material layer 106.

More specifically, the transistor 100 in conjunction with the p-type material layer 106 and the back barrier layer 180 as disclosed, associated structures thereof, and/or associated processes thereof, may provide a systematic approach to reducing lag. More specifically, the transistor 100 of the disclosure may implement the p-type material layer 106 and/or processes thereof as a drain lag reduction structure and/or process to reduce the drain lag effect and the transistor 100 of the disclosure may implement the back barrier layer 180 and/or processes thereof as a gate lag reduction structure and/or process to reduce the gate lag effect.

In this regard, it has been determined that impurities such as silicon, oxygen, carbon, and/or the like in the back barrier layer 180 may increase gate lag. In particular, that impurities provide trapping, leaking, and/or the like. More specifically, aspects of the disclosure may implement the back barrier layer 180 with low background impurity levels. In one aspect, the disclosure may implement AlGaN for the back barrier layer 180 with low background impurity levels. In this regard, impurities have been found to build complexes with dislocations, such as point defects, which also act as deep trap levels.

More specifically, the disclosure may implement AlGaN for the back barrier layer 180 with low background impurity levels where low background impurity levels may be defined as impurities less than 1E17 per cubic cm. (centimeter), less than 5E16 per cubic cm., less than 1E16 per cubic cm., or less than 1E15 per cubic cm. Moreover, the disclosure may implement AlGaN for the back barrier layer 180 with low background impurity levels of silicon, oxygen, carbon, and/or the like where low background impurity levels of silicon, oxygen, carbon, and/or the like may be defined as impurities of silicon, oxygen, carbon, and/or the like less than 1E17 per cubic cm. (centimeter), less than 5E16 per cubic cm., less than 1E16 per cubic cm., or less than 1E15 per cubic cm.

Moreover, the disclosure may implement AlGaN for the back barrier layer 180 with low background impurity levels of silicon and oxygen where low background impurity levels of silicon and oxygen may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of silicon and oxygen where low background impurity levels of silicon and oxygen may be defined as impurities of silicon and oxygen less than 1E16. Moreover, the disclosure may implement AlGaN for the back barrier layer 180 with low background impurity levels of carbon where low background impurity levels of carbon may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of carbon where low background impurity levels of carbon may be defined as impurities of carbon less than 5E16.

Additionally or alternatively, low background impurity levels may be defined as impurities between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon, oxygen, carbon, and/or the like between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of carbon between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

Additionally, the back barrier layer 180 may be configured to provide a sharp interface to the channel layer 182.

This interface may function as a barrier for electrons. In aspects of the transistor 100 of the disclosure, the back barrier layer 180 may be a graded layer. In one aspect, the back barrier layer 180 may be a step-graded layer. In one aspect, the back barrier layer 180 may be multiple layers.

In particular aspects, the back barrier layer 180 may be a low Al concentration AlGaN buffer layer to provide a barrier to reduce electron injection into the buffer layer. In this regard, the barrier to reduce electron injection into the buffer layer results in a gate lag reduction structure, a gate lag elimination structure, and/or the like. For example, the back barrier layer 180 may be implemented with about 4% Al concentration AlGaN to provide a barrier to reduce electron injection into the buffer. In this regard, about may be within 0.5%, 1%, 1.5%, or 2%. In particular aspects, the back barrier layer 180 may be implemented with AlGaN with an Al concentration of 1% to 6%, 1% to 1.5%, 1.5% to 2%, 2% to 2.5%, 2.5% to 3%, 3% to 3.5%, 3.5% to 4%, 3.5% to 4.5%, 3.8% to 4.2%, 4% to 4.5%, 4.5% to 5%, 5% to 5.5%, or 5.5% to 6%, to provide a barrier to reduce electron injection into the buffer, a gate lag reduction structure, a gate lag elimination structure, and/or the like.

In aspects, the transistor 100 may have limited gate lag during a limited operational envelope. For example, up to about −8V (volts) reverse bias on the gate for certain implementations of a GaN HEMT. However, the back barrier layer 180 may be configured as a gate lag reduction, a gate lag elimination, and/or the like for implementations outside the limited operational envelope where gate lag trapping effects may be present. For example, implementations of the transistor 100 where the gate voltage goes below −8V. In particular, the back barrier layer 180 configured at least in part as a gate lag reduction structure, a gate lag elimination structure, and/or the like in conjunction with the p-type material layer 106 configured at least in part as a drain lag reduction structure, a drain lag elimination structure, and/or the like operate together in a synergistic manner to reduce overall lag of the transistor 100 during such low gate voltage conditions. As further described herein, this synergistic overall reduction of lag of the transistor 100 was an unexpected result of the combined structures of the back barrier layer 180 and the p-type material layer 106.

Additionally, the back barrier layer 180 of the transistor 100 may be further configured and/or processed to reduce and/or limit gate lag effect by implementing epitaxial growth thereof. In particular, the back barrier layer 180 of the transistor 100 may be further configured and/or processed to reduce and/or limit gate lag effect by implementing epitaxial growth while reducing incorporation of background impurities such as silicon (Si), oxygen (O), carbon (C), and/or the like in the AlGaN of implementations of the back barrier layer 180. More specifically, aspects of the disclosure may implement the back barrier layer 180 with low background impurity levels. In one aspect, the disclosure may implement AlGaN for the back barrier layer 180 with low background impurity levels. In this regard, impurities have been found to build complexes with dislocations, such as point defects, which also act as deep trap levels. In this regard, incorporation in the back barrier layer 180 of a high concentration of high level background impurities has been found to be a problem when using AlGaN for the back barrier layer 180. The back barrier layer 180 may implement epitaxial growth with impurity incorporation significantly reduced. More specifically, the back barrier layer 180 may be implemented with epitaxial growth of AlGaN reducing incorporation of background impurities such as silicon (Si), oxygen (O), carbon (C), and/or the like.

More specifically, the disclosure may implement AlGaN for the back barrier layer 180 with low background impurity levels where low background impurity levels may be defined as impurities less than 1E17 per cubic cm. (centimeter), less than 5E16 per cubic cm., less than 1E16 per cubic cm., or less than 1E15 per cubic cm. Moreover, the disclosure may implement AlGaN for the back barrier layer 180 with low background impurity levels of silicon, oxygen, carbon, and/or the like where low background impurity levels of silicon, oxygen, carbon, and/or the like may be defined as impurities of silicon, oxygen, carbon, and/or the like less than 1E17 per cubic cm. (centimeter), less than 5E16 per cubic cm., less than 1E16 per cubic cm., or less than 1E15 per cubic cm.

Moreover, the disclosure may implement AlGaN for the back barrier layer 180 with low background impurity levels of silicon and oxygen where low background impurity levels of silicon and oxygen may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of silicon and oxygen where low background impurity levels of silicon and oxygen may be defined as impurities of silicon and oxygen less than 1E16. Moreover, the disclosure may implement AlGaN for the back barrier layer 180 with low background impurity levels of carbon where low background impurity levels of carbon may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of carbon where low background impurity levels of carbon may be defined as impurities of carbon less than 5E16.

Additionally or alternatively, low background impurity levels may be defined as impurities between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon, oxygen, carbon, and/or the like between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of carbon between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In this regard, it has been discovered that a source of defects may be impurities, which may act as non-intentional doping and create trap centers and/or the like in the transistor 100. To prevent deep penetration of electrons in the GaN buffer of the transistor 100 or the channel layer 182 of the transistor 100, the back barrier layer 180 may be implemented as an AlGaN buffer as described herein and may be used to confine electrons in the channel layer 182 close to the back barrier layer 180. The disclosed implementation and configuration of the back barrier layer 180 has additionally proven to improve break-down voltage in the transistor 100 and/or GaN HEMT implementations of the transistor 100.

Accordingly, the transistor 100 may include the p-type material layer 106 as described herein in order for drain lag to be greatly reduced and/or eliminated. However, the transistor 100 may still suffer from the gate lag effect. For example, the transistor 100 may still suffer from the gate lag effect at elevated negative gate voltages. Traps in the buffer of the transistor 100 may be a cause this delay. Accordingly, the back barrier layer 180 may be implemented with AlGaN with very low background impurity levels of Carbon, Silicon, Oxygen, and/or the like grown on the p-type material layer 106 to dramatically improve the electron confinement and reduce and/or eliminate gate lag as well as may reduce and/or eliminate overall lag.

In particular aspects, the back barrier layer 180 may include a planar upper surface that is generally parallel to an X axis as illustrated in FIG. 14 and/or is generally parallel to an Z axis (perpendicular to the X axis and the Y axis). In particular aspects, the back barrier layer 180 may include a planar lower surface that is generally parallel to an X axis as illustrated in FIG. 14 and/or is generally parallel to an Z axis (perpendicular to the X axis and the Y axis). Where upper and lower are defined along the Y axis.

In some aspects, a channel layer 182 may be formed directly on the back barrier layer 180 or on the back barrier layer 180 with intervening layer(s). In one aspect, the channel layer 182 is formed of GaN.

Depending on the aspect, the channel layer 182 may be formed of different suitable materials such as a Group III-nitride such as $Al_xGa_yIn_{(1-x-y)}N$ (where $0<=x<=1$, $0<=y<=1$, $x+y<=1$), e.g., GaN, AlGaN, AlN, and the like, or another suitable material. The channel layer 182 or portions thereof may be doped with dopants, such as, Fe and/or C or alternatively can be wholly or partly undoped.

In particular aspects, the channel layer 182 may include a planar upper surface that is generally parallel to an X axis as illustrated in FIG. 14 and/or is generally parallel to an Z axis (perpendicular to the X axis and the Y axis). In particular aspects, the channel layer 182 may include a planar lower surface that is generally parallel to an X axis as illustrated in FIG. 14 and/or is generally parallel to an Z axis (perpendicular to the X axis and the Y axis). Where upper and lower are defined along the Y axis.

In one aspect, the channel layer 182 may be high purity GaN. In one aspect, the channel layer 182 may be high purity GaN that may be a low-doped n-type. In one aspect, a combined thickness of the channel layer 182 and the back barrier layer 180 may have a thickness defined as a distance between an upper surface of the substrate layer 102 and a lower surface of the barrier layer 108. In one aspect, a combined thickness of the channel layer 182 and the back barrier layer 180 along the Y axis between an upper surface of the channel layer 182 and a lower surface the back barrier layer 180 may be 10%-20%, 20%-30%, 30%-40%, 40%-50%, 50%-60%, 60%-70%, 70%-80%, or 80%-90% of a thickness of the substrate layer 102. In one aspect, a combined thickness of the channel layer 182 and the back barrier layer 180 may be less than 0.8 microns, less than 0.7 microns, less than 0.6 microns, less than 0.5 microns, or less than 0.4 microns. In one aspect, a combined thickness of the channel layer 182 and the back barrier layer 180 may have a range of 0.8 microns to 0.6 microns, 0.7 microns to 0.5 microns, 0.6 microns to 0.4 microns, 0.5 microns to 0.3 microns, 0.4 microns to 0.2 microns, or 0.7 microns to 0.3 microns. In one aspect, the back barrier layer 180 may be thicker than the channel layer 182 along the Y axis between an upper surface and lower surface of each. In one aspect, the back barrier layer 180 may be 10%, 20%, 30%, 40%, 50%, 60%, 70%, 80%, 90%, 100%, 120%, 140%, or 160% thicker than the channel layer 182 along the Y axis between an upper surface and lower surface of each. In one aspect, the back barrier layer 180 may be 10%-20%, 20%-30%, 30%-40%, 40%-50%, 50%-60%, 60%-70%, 70%-80%, 80%-90%, 90%-100%, 100%-120%, 120%-140%, or 140%-160% thicker than the channel layer 182 along the Y axis between an upper surface and lower surface of each.

In one aspect, the transistor 100 may have an intervening layer(s) thickness defined as a length between an upper surface of the substrate layer 102 and a lower surface of the barrier layer 108. In one aspect, the intervening layer(s) thickness may be less than 0.8 microns, less than 0.7 microns, less than 0.6 microns, less than 0.5 microns, or less than 0.4 microns. In one aspect, the intervening layer(s) thickness may have a range of 0.8 microns to 0.6 microns, 0.7 microns to 0.5 microns, 0.6 microns to 0.4 microns, 0.5 microns to 0.3 microns, or 0.4 microns to 0.2 microns.

In one aspect of the transistor 100 as described herein, the p-type material layer 106 may be doped as highly as possible with minimum achievable sheet resistance. In one aspect, the p-type material layer 106 may have an implantation concentration less than $10^{19}$. In one aspect, the p-type material layer 106 may have an implantation concentration less than $10^{20}$. In one aspect, the p-type material layer 106 may have an implantation concentration of $10^{17}$-$10^{20}$, $10^{19}$-$10^{20}$, $10^{18}$-$10^{19}$, or $10^{17}$-$10^{18}$. In one aspect, the p-type material layer 106 may have an implantation concentration $10^{19}$ or greater. In one aspect, the p-type material layer 106 may have an implantation concentration of $10^{18}$-$10^{20}$, $10^{18}$-$10^{19}$, or $10^{19}$-$10^{20}$.

In one aspect of the transistor 100 as described herein, the p-type material layer 106 doping may be less than 1E17 $cm^3$. In one aspect, the p-type material layer 106 doping may be less than 2E17 $cm^3$. In one aspect, the p-type material layer 106 doping may be less than 6E17 $cm^3$. In one aspect, the p-type material layer 106 doping may be less than 2E18 $cm^3$. In one aspect, the p-type material layer 106 doping may be in the range of 5E15 to 5E17 per $cm^3$. In these aspects, the p-type material layer 106 doping concentration may be greater than a doping concentration of the p-type material layer 106.

Figure 16:
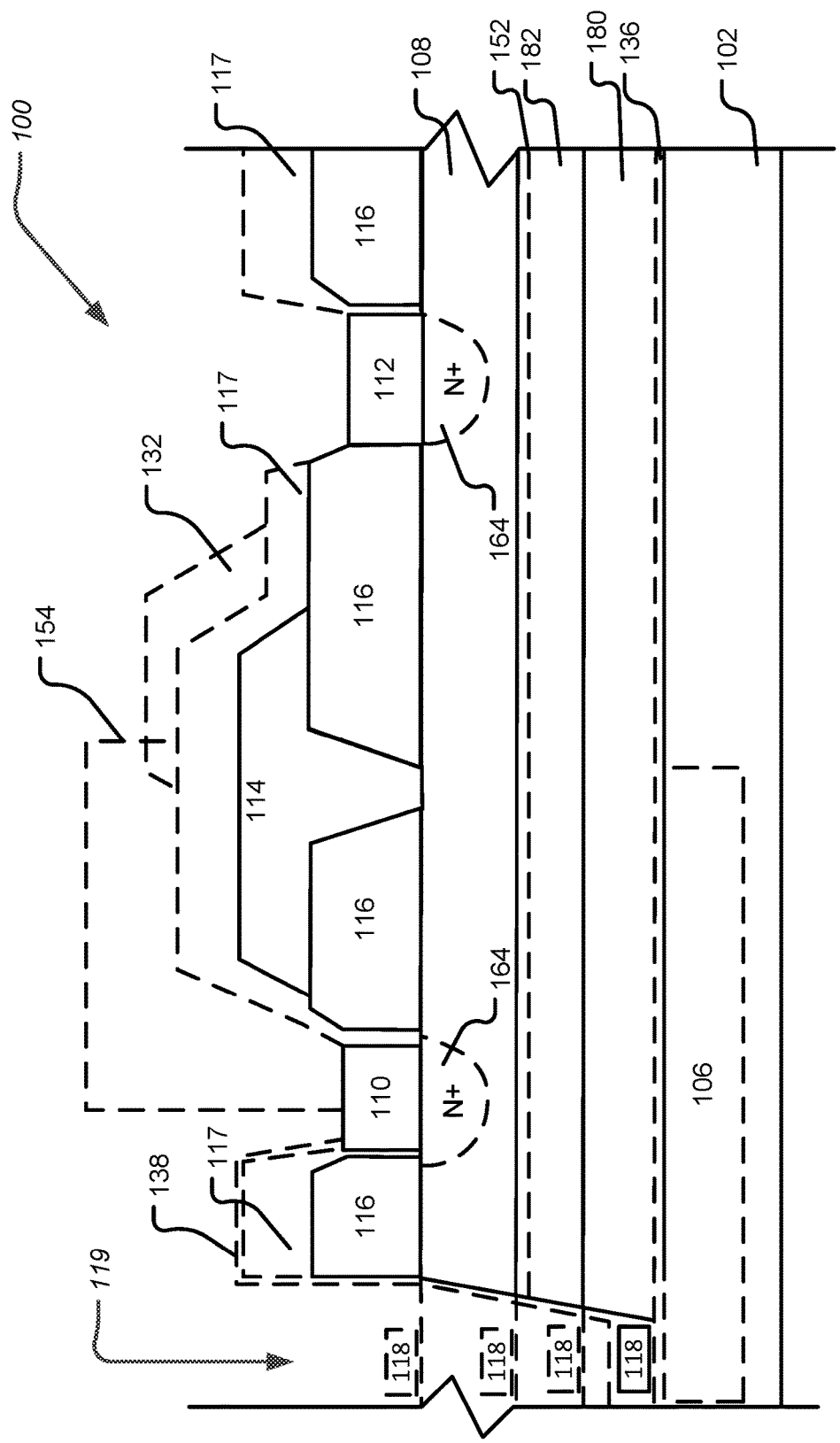
FIG. 16 shows a cross-sectional view of another aspect of a transistor according to the disclosure.

FIG. 16 shows a cross-sectional view of another aspect of a transistor according to the disclosure.

In particular, FIG. 16 shows a cross-sectional view of a transistor 100. More specifically, the transistor 100 described in detail herein may be utilized in conjunction with the transistor package 200, the overload detection circuit 302, the recovery enhancement circuit 300 and/or the like as described above.

In particular, FIG. 16 illustrates a transistor 100 that may include any one or more aspects of the disclosure described herein. In particular, the transistor 100 of FIG. 16 may include the p-type material layer 106 as described above.

In various aspects of the disclosure, the p-type material layer 106 of the transistor 100 may be buried within the substrate layer 102 and otherwise may not be electrically connected to any portion of the transistor 100. In one aspect as illustrated in FIG. 16, the transistor 100 may include a p-type material contact 118 that may be electrically connected to receive an external signal, bias, and/or the like. The p-type material contact 118 may be electrically connected and arranged in the substrate layer 102, the p-type material layer 106, the substrate layer 102, the back barrier layer 180, the channel layer 182, the barrier layer 108, and/or the like. The p-type material contact 118 may be formed in a recess 119 in the substrate layer 102, the p-type material layer 106, the substrate layer 102, the back barrier layer 180, the barrier layer 108, and/or the like. The recess 119 may extend down to the p-type material layer 106 to allow for the p-type material contact 118 to be created there. The recess 119 may be formed by etching, and may also use a material to define the recess 119. The material may be removed after the recess 119 has been created.

In certain embodiments, the source 110 may be electrically connected to the p-type material contact 118 through a connection 138. In certain embodiments, the field plate 132 may be electrically connected to the source 110 through the connection 154. In certain embodiments, the field plate 132 may be connected to the source 110, and the source 110 may be connected to the p-type material contact 118 through the connection 138.

In certain embodiments, the gate 114 may be electrically connected to the p-type material contact 118 through a connection (not shown). In certain embodiments, the field plate 132 may be electrically connected to the gate 114 through the connection. In certain embodiments, the field plate 132 may be connected to the gate 114, and the gate 114 may be connected to the p-type material contact 118 through the connection.

FIG. 16 is meant to broadly describe different embodiments of the present invention (e.g., different p-layer and/or field plate configurations), but in the interest of clarity, not all embodiments are expressly depicted. It should be understood that the transistor 100 structures of the present invention can be utilized with a variety of p-type material layer 106 structures as described herein and otherwise. In certain embodiments, the p-type material layer 106 structure may be electrically connected to a separate bias voltage/control signal, electrically connected to the source 110 or electrically connected to the gate 114 or not electrically connected to the source 110, the gate 114, and the separate bias/control signal. Such electrical connection can be through a via in the epitaxial material and/or an electrical connection outside and/or at an edge of the epitaxial material. For example, the via may be structured within the recess 119. The p-type material layer 106 can be formed or structured in any of the different variations described herein or otherwise. Depending on the embodiment, various field plate 132 configurations are possible. For example, field plates 132 may be integral with the gate 114, single or multiple field plates 132 are possible with or without intervening dielectric spacer layers between the field plates 132. A field plate 132 can vertically overlap or not vertically overlap with the gate 114 or an underlying field plate 132. The field plates 132 may be electrically connected to the gate 114 or the source 110 or one or more field plates 132 connected to the gate 114, one or more filed plates 132 connected to the source 110, and/or one or more field plates 132 connected to neither the source 110 nor the gate 114.

Accordingly, the disclosure has presented a solution to reduce an impact of overload, reduce recovery time, reduce a gate lag, reduce an impact of gate lag, reduce an increase of gate lag, reduce gate lag trapping effects, and/or the like of the transistor 100 and/or the transistor package 200 as well as addressing gate lag effect in Group-III nitride HEMTs and improving the performance of such devices. Additionally, the disclosure has presented a solution to addressing traps that cause memory effects that adversely affect performance. Moreover, the disclosure has set forth a simpler alternative solution to forming p-type layers in HEMTs. The disclosed structure can be readily fabricated with currently available techniques. Moreover, the disclosed use of a high-purity material reduces drain lag effects. Additionally, the disclosed p-type material layer provides a retarding electric field to obtain good electron confinement with low leakage. Additionally, aspects of this disclosure have described in detail variations of transistors with p-type layers and the ways those p-type layers are formed. The disclosed transistors maximize RF power, allow for efficient discharge, and maximize breakdowns.

According to aspects of this disclosure, one or more aspects of the transistor 100 as disclosed may be utilized for high power RF (radio frequency) amplifiers, for high power radiofrequency (RF) applications, and also for low frequency high power switching applications. The advantageous electronic and thermal properties of GaN HEMTs also make them very attractive for switching high power RF signals. In this regard, the disclosure has described a structure with a buried p-layer under the source region to obtain high breakdown voltage in HEMTs for various applications including power amplifiers while at the same time eliminating drifts in device characteristics arising from trapping in the buffer and/or semi-insulating substrates. Use of buried p-layers may also be important in HEMTs for RF switches to obtain high breakdown voltage and good isolation between the input and output.

According to aspects of this disclosure, one or more aspects of the transistor 100 as disclosed may be utilized to implement an amplifier, a radar amplifier, radar components, a microwave radar amplifier, a power module, a gate driver, a component such as a General-Purpose Broadband component, a Telecom component, a L-Band component, a S-Band component, a X-Band component, a C-Band component, a Ku-Band component, a UHF-Band component, a Satellite Communications component, a Doherty configuration, and/or the like. The L band is the Institute of Electrical and Electronics Engineers (IEEE) designation for the range of frequencies in the radio spectrum from 1 to 2 gigahertz (GHz). The S band is a designation by the IEEE for a part of the microwave band of the electromagnetic spectrum covering frequencies from 2 to 4 GHz. The X band is the designation for a band of frequencies in the microwave radio region of the electromagnetic spectrum indefinitely set at approximately 7.0-11.2 GHz. The C-band is the designation given to the radio frequencies from 4 to 8 GHz. The Ku band is the portion of the electromagnetic spectrum in the microwave range of frequencies from 12 to 18 GHz. The UHF band is the portion of the electromagnetic spectrum in the range of frequencies from 300 MHz to 1000 MHz.

According to aspects of this disclosure, one or more aspects of the transistor 100 as disclosed may be configured in a package and may be implemented as a RF package, a MMIC RF package, and/or the like and may house RF devices. In particular, the RF devices may implement one or more of resistors, inductors, capacitors, Metal-Oxide-Silicon (MOS) capacitors, impedance matching circuits, matching circuits, input matching circuits, output matching circuits, intermediate matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, integrated passive devices (IPD), matching networks, and the like to support various functional technology as input, output, and/or intrastage functions to the package, and/or the like. The package implemented as a MMIC package may further include the transistor 100. The package implemented as a MMIC package may include, connect, support, or the like a radar transmitter functions, a microwave radar transmitter, microwave radar transmitter functions, a radar receiver, radar receiver functions, a microwave radar receiver, microwave radar receiver functions, and/or the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An apparatus, comprising:
a substrate;
a group III-Nitride barrier layer;
a source electrically coupled to the group III-Nitride barrier layer;
a gate on the group III-Nitride barrier layer;
a drain electrically coupled to the group III-Nitride barrier layer;
a p-region being arranged at or below the group III-Nitride barrier layer;
a recovery enhancement circuit configured to reduce an impact of an overload received by the gate; and
a group III-Nitride buffer layer on the substrate,
wherein at least a portion of the p-region is arranged vertically below at least one of the following: the source, the gate, an area between the gate and the drain; and
wherein the group III-Nitride barrier layer is arranged on the group III-Nitride buffer layer, the group III-Nitride barrier layer comprising a higher bandgap than a bandgap of the group III-Nitride buffer layer.

2. An apparatus, comprising:
a substrate;
a group III-Nitride barrier layer;
a source electrically coupled to the group III-Nitride barrier layer;
a gate on the group III-Nitride barrier layer;
a drain electrically coupled to the group III-Nitride barrier layer;
a p-region being arranged at or below the group III-Nitride barrier layer;
a recovery enhancement circuit configured to reduce an impact of an overload received by the gate;
a group III-Nitride back barrier layer on the substrate; and
a group III-Nitride channel layer on the group III-Nitride back barrier layer,
wherein at least a portion of the p-region is arranged vertically below at least one of the following: the source, the gate, an area between the gate and the drain; and
wherein the group III-Nitride barrier layer is on the group III-Nitride channel layer, the group III-Nitride barrier layer comprising a higher bandgap than a bandgap of the group III-Nitride channel layer.

3. An apparatus, comprising:
a substrate;
a group III-Nitride barrier layer;
a source electrically coupled to the group III-Nitride barrier layer;
a gate on the group III-Nitride barrier layer;
a drain electrically coupled to the group III-Nitride barrier layer;
a p-region being arranged at or below the group III-Nitride barrier layer; and
a recovery enhancement circuit configured to provide a bias voltage and/or a dynamic electrical pulse in order to reduce an impact of an overload received by the gate,
wherein at least a portion of the p-region is arranged vertically below at least one of the following: the source, the gate, an area between the gate and the drain.

4. The apparatus of claim 3 wherein the recovery enhancement circuit is further configured provide the bias voltage and/or the dynamic electrical pulse in order to a reduce recovery time, reduce a gate lag, reduce an impact of gate lag, reduce an increase of gate lag, reduce an impact of the overload, and/or reduce gate lag trapping effects.

5. The apparatus of claim 3 wherein the recovery enhancement circuit is configured provide the bias voltage and/or the dynamic electrical pulse to the p-region in response to an overload detection circuit.

6. The apparatus of claim 3 wherein the recovery enhancement circuit is configured provide the bias voltage and/or the dynamic electrical pulse to the gate in response to an overload detection circuit.

7. The apparatus of claim 3 wherein the recovery enhancement circuit is configured provide the bias voltage and/or the dynamic electrical pulse to the drain in response to an overload detection circuit.

8. The apparatus of claim 3 further comprising an overload detection circuit, wherein the recovery enhancement circuit is configured to provide the bias voltage and/or the dynamic electrical pulse responsive to the overload detection circuit.

9. The apparatus of claim 8 wherein the overload detection circuit comprises one or more of the following: circuitry configured to detect a high voltage level, circuitry configured to detect a high current level, circuitry configured to detect a high voltage level signal, and circuitry configured to detect a high current level signal.

10. The apparatus of claim 8 wherein the overload detection circuit is configured to detect an overload and thereafter operate the recovery enhancement circuit to provide the bias voltage and/or the dynamic electrical pulse.

11. The apparatus of claim 8 wherein the overload detection circuit is configured to detect the overload by detecting a high voltage level, a high current level, a high voltage level signal, and/or a high current level signal at the gate.

12. The apparatus of claim 8 wherein the overload detection circuit is further configured to detect when there is no longer a high voltage level, a high current level, a high voltage level signal, and/or a high current level signal applied to the gate and initiate operation of the recovery enhancement circuit to provide the bias voltage and/or the dynamic electrical pulse.

13. The apparatus of claim 8 wherein the overload detection circuit comprises one or more of the following: a voltage sensor, a current sensor, and a comparator.

14. The apparatus of claim 3 wherein the recovery enhancement circuit comprises one or more the following: a signal source, a signal generator, a bias voltage source, a bias voltage generator, a dynamic electrical pulse source, and a dynamic electrical pulse generator.

15. The apparatus of claim 3 further comprising a contact to the p-region and the contact electrically connecting the recovery enhancement circuit to the p-region, wherein the recovery enhancement circuit is configured provide the bias voltage and/or the dynamic electrical pulse to the contact to the p-region in response to an overload detection circuit.

16. The apparatus of claim 3, wherein:
a part of a source side of the substrate is free of the p-region; and
a part of a drain side of the substrate is free of the p-region.

17. The apparatus of claim 3, further comprising a field plate, wherein the field plate is electrically coupled to the source.

18. The apparatus of claim 17, wherein the p-region is structured and arranged to extend a limited length parallel to the group III-Nitride barrier layer such that the p-region is not located vertically below areas past the source and the drain.

19. The apparatus of claim 3 wherein the p-region is arranged under and across a length of the gate and extends toward the source and the drain.

20. The apparatus of claim 1, wherein:
a portion of the substrate includes the p-region located vertically below the source; and
another portion of the substrate does not include the p-region located vertically below the source.

21. The apparatus of claim 1, wherein:
the substrate does not include the p-region located vertically below the source; and
the substrate does not include the p-region located vertically below the drain.

22. The apparatus of claim 1, wherein the p-region is structured and arranged such that no portion of the p-region is located vertically below the drain.

23. The apparatus of claim 1, further comprising a connection to the p-region that is electrically connected to the gate.

24. The apparatus of claim 1, further comprising a field plate, wherein the p-region is implanted.

25. The apparatus of claim 1 wherein:
a distance LGPS defines a length of a portion of the p-region from a lower corner of the gate on a source side toward the source;
a distance LGPD defines a length of a portion of the p-region from a lower corner of the gate on a drain side toward the drain; and
the distance LGPS greater than the distance LGPD.

26. The apparatus of claim 1 wherein the p-region extends toward the source but does not vertically overlap the source.

27. The apparatus of claim 1 wherein the p-region vertically overlaps the source.

28. The apparatus of claim 1 wherein the p-region extends toward the drain but does not vertically overlap the drain.

29. The apparatus of claim 1 wherein the p-region vertically overlaps the drain.

30. The apparatus of claim 1 wherein the p-region is electrically connected to the gate.

31. The apparatus of claim 1 wherein the p-region comprises no direct electrical connections.

32. The apparatus of claim 1 wherein the p-region is electrically connected to the source.

33. A method of making a device comprising:
providing a substrate;
providing a group III-Nitride barrier layer;
electrically coupling a source to the group III-Nitride barrier layer;
arranging a gate on the group III-Nitride barrier layer;
electrically coupling a drain to the group III-Nitride barrier layer;
configuring a recovery enhancement circuit to provide a bias voltage and/or a dynamic electrical pulse in order to reduce an impact of an overload received by the gate; and
providing a p-region being arranged at or below the group III-Nitride barrier layer,
wherein at least a portion of the p-region is arranged vertically below at least one of the following: the source, the gate, an area between the gate and the drain.

34. The method of claim 33 further comprising configuring the recovery enhancement circuit to provide the bias voltage and/or the dynamic electrical pulse in order to reduce recovery time, reduce a gate lag, reduce an impact of gate lag, reduce an increase of gate lag, reduce an impact of the overload, and/or reduce gate lag trapping effects.

35. The method of claim 33 further comprising configuring the recovery enhancement circuit to provide the bias voltage and/or the dynamic electrical pulse to the p-region in response to an overload detection circuit.

36. The method of claim 33 further comprising configuring the recovery enhancement circuit to provide the bias voltage and/or the dynamic electrical pulse to the gate in response to an overload detection circuit.

37. The method of claim 33 further comprising configuring the recovery enhancement circuit to provide the bias voltage and/or the dynamic electrical pulse to the drain in response to an overload detection circuit.

38. The method of claim 33 further comprising providing an overload detection circuit, wherein the recovery enhancement circuit is configured to provide the bias voltage and/or the dynamic electrical pulse responsive to the overload detection circuit.

39. The method of claim 38 wherein the overload detection circuit comprises one or more of the following: circuitry configured to detect a high voltage level, circuitry configured to detect a high current level, circuitry configured to detect a high voltage level signal, and circuitry configured to detect a high current level signal.

40. The method of claim 38 further comprising configuring the overload detection circuit to detect an overload and thereafter operate the recovery enhancement circuit to provide the bias voltage and/or the dynamic electrical pulse.

41. The method of claim 38 further comprising configuring the overload detection circuit to detect the overload by detecting a high voltage level, a high current level, a high voltage level signal, and/or a high current level signal at the gate.

42. The method of claim 38 further comprising configuring the overload detection circuit to detect when there is no longer a high voltage level, a high current level, a high voltage level signal, and/or a high current level signal applied to the gate and initiate operation of the recovery enhancement circuit to provide the bias voltage and/or the dynamic electrical pulse.

43. The method of claim 38 wherein the overload detection circuit comprises one or more of the following: a voltage sensor, a current sensor, and a comparator.

44. The method of claim 33 wherein the recovery enhancement circuit comprises one or more the following: a signal source, a signal generator, a bias voltage source, a bias voltage generator, a dynamic electrical pulse source, and a dynamic electrical pulse generator.

45. The method of claim 33 further comprising a contact to the p-region and the contact electrically connecting the recovery enhancement circuit to the p-region,
   wherein the recovery enhancement circuit is configured provide the bias voltage and/or the dynamic electrical pulse to the contact to the p-region in response to an overload detection circuit.

46. The method of claim 33, further comprising:
a group III-Nitride buffer layer on the substrate,
wherein the group III-Nitride barrier layer is arranged on the group III-Nitride buffer layer, the group III-Nitride barrier layer comprising a higher bandgap than a bandgap of the group III-Nitride buffer layer.

47. The method of claim 33, further comprising:
a group III-Nitride back barrier layer on the substrate; and
a group III-Nitride channel layer on the group III-Nitride back barrier layer, wherein the group III-Nitride barrier layer is on the group III-Nitride channel layer, the group III-Nitride barrier layer comprising a higher bandgap than a bandgap of the group III-Nitride channel layer.

48. The method of claim 33, wherein:
a part of a source side of the substrate is free of the p-region; and
a part of a drain side of the substrate is free of the p-region.

49. The method of claim 33, wherein:
a portion of the substrate includes the p-region located vertically below the source; and
another portion of the substrate does not include the p-region located vertically below the source.

50. The method of claim 33, wherein:
the substrate does not include the p-region located vertically below the source; and
the substrate does not include the p-region located vertically below the drain.

51. The method of claim 33, wherein the p-region is structured and arranged such that no portion of the p-region is located vertically below the drain.

52. The method of claim 33, further comprising a connection to the p-region that is electrically connected to the gate.

53. The method of claim 33, further comprising a field plate, wherein the p-region is implanted.

54. The method of claim 33, further comprising a field plate, wherein the field plate is electrically coupled to the source.

55. The method of claim 33, wherein the p-region is structured and arranged to extend a limited length parallel to the group III-Nitride barrier layer such that the p-region is not located vertically below areas past the source and the drain.

56. The method of claim 33 wherein the p-region is arranged under and across a length of the gate and extends toward the source and the drain.

57. The method of claim 33 wherein:
   a distance LGPS defines a length of a portion of the p-region from a lower corner of the gate on a source side toward the source;
   a distance LGPD defines a length of a portion of the p-region from a lower corner of the gate on a drain side toward the drain; and
   the distance LGPS greater than the distance LGPD.

58. The method of claim 33 wherein the p-region extends toward the source but does not vertically overlap the source.

59. The method of claim 33 wherein the p-region vertically overlaps the source.

60. The method of claim 33 wherein the p-region extends toward the drain but does not vertically overlap the drain.

61. The method of claim 33 wherein the p-region vertically overlaps the drain.

62. The method of claim 33 wherein the p-region is electrically connected to the gate.

63. The method of claim 33 wherein the p-region comprises no direct electrical connections.

64. The method of claim 33 wherein the p-region is electrically connected to the source.

* * * * *